United States Patent
Murakami et al.

(12) 
(10) Patent No.: US 6,392,629 B1
(45) Date of Patent: May 21, 2002

(54) DRIVE CIRCUIT FOR LIQUID-CRYSTAL DISPLAYS AND LIQUID-CRYSTAL DISPLAY INCLUDING DRIVE CIRCUITS

(75) Inventors: Hiroshi Murakami; Mitsuharu Nakazawa; Ken-ichi Nakabayashi, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/565,916

(22) Filed: May 5, 2000

Related U.S. Application Data

(62) Division of application No. 09/037,544, filed on Mar. 10, 1998, now Pat. No. 6,243,066.

(30) Foreign Application Priority Data

Oct. 8, 1997 (JP) ............................................. 9-275911

(51) Int. Cl.⁷ ................................................ G09G 3/36
(52) U.S. Cl. ........................... 345/98; 345/92; 345/100; 345/88
(58) Field of Search .............................. 345/87, 88, 92, 345/98, 100, 101, 102, 103, 211, 212, 213

(56) References Cited

U.S. PATENT DOCUMENTS

| | | | | |
|---|---|---|---|---|
| 5,457,474 A | * | 10/1995 | Ikeda | 345/92 |
| 5,461,424 A | * | 10/1995 | Shimizu | 348/443 |
| 5,617,111 A | * | 4/1997 | Saitoh | 345/100 |
| 5,731,795 A | * | 3/1998 | Kanda et al. | 348/94 |
| 5,818,402 A | * | 10/1998 | Park et al. | 345/58 |
| 5,889,503 A | * | 3/1999 | Kikuchi et al. | 345/98 |
| 5,973,661 A | * | 10/1999 | Kobayashi et al. | 345/100 |
| 6,091,390 A | * | 7/2000 | Sim | 345/98 |
| 6,091,391 A | * | 7/2000 | Ling et al. | 345/98 |

FOREIGN PATENT DOCUMENTS

| | | |
|---|---|---|
| JP | 6149188 | 5/1994 |
| JP | 7020820 | 1/1995 |
| JP | 9265277 | 10/1997 |

* cited by examiner

*Primary Examiner*—Richard A. Hjerpe
*Assistant Examiner*—Kimnhung Nguyen
(74) *Attorney, Agent, or Firm*—Greer, Burns & Crain, Ltd.

(57) ABSTRACT

Disclosed is a liquid-crystal drive circuit having a simple configuration and being not susceptible to the characteristic of a device. The liquid-crystal drive circuit includes an auxiliary capacitor, applies a first voltage to a driving buffer, temporarily accumulates an output voltage of the driving buffer in the auxiliary capacitor, applies a voltage produced by subtracting the potential at the auxiliary capacitor from a second voltage to the driving buffer, and applies an output of the driving buffer onto a data bus.

14 Claims, 34 Drawing Sheets

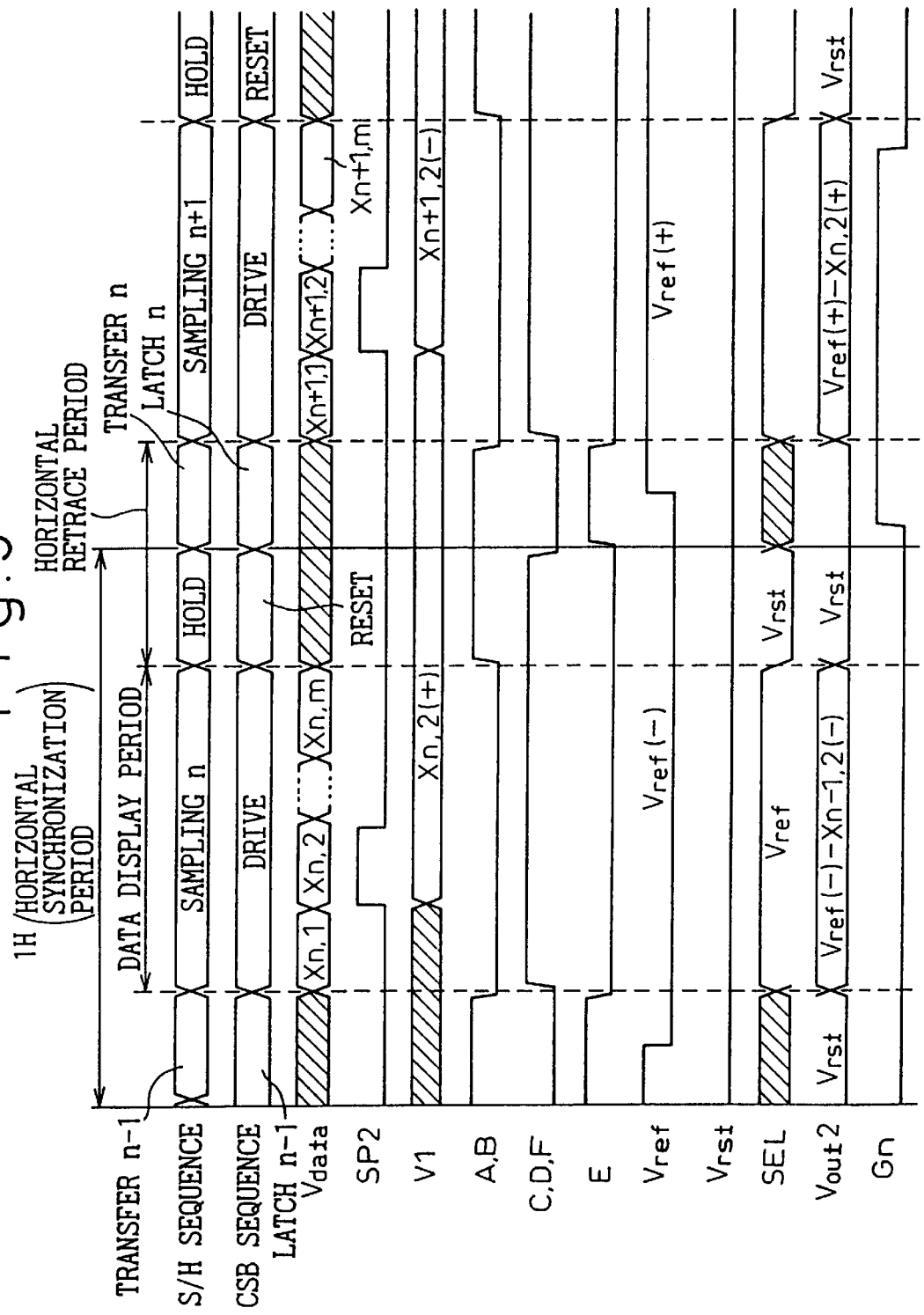

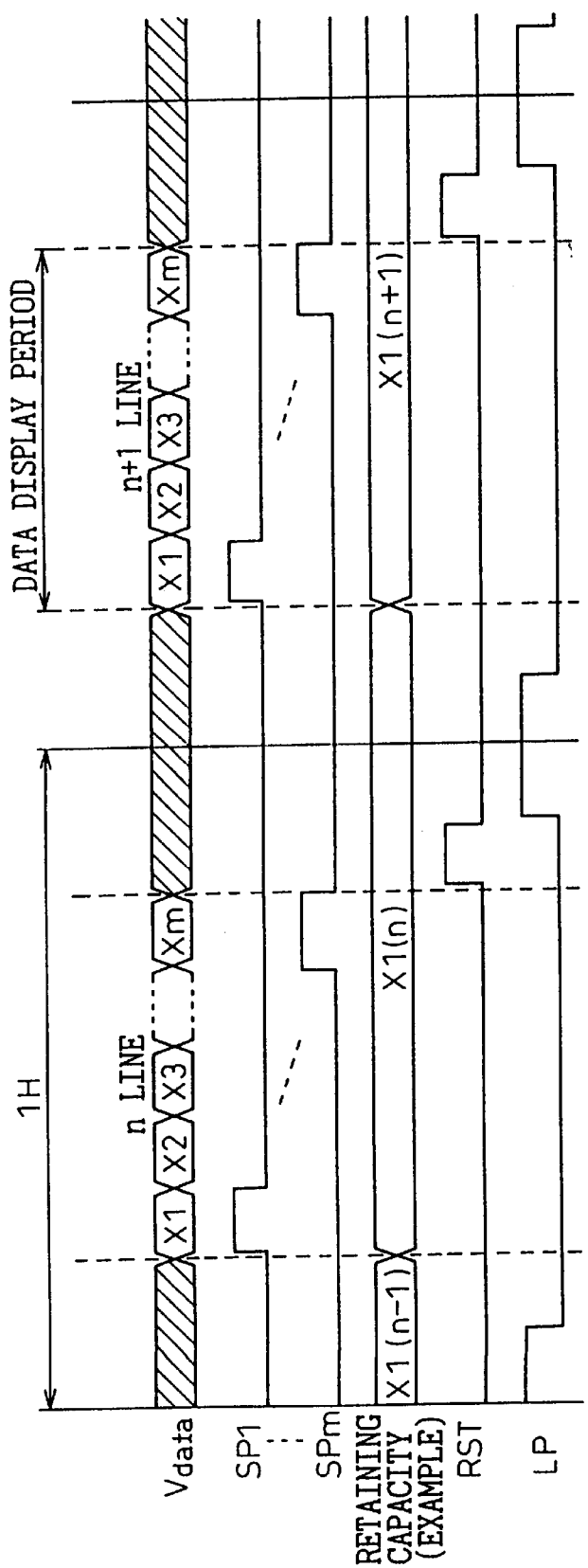

DRIVE CIRCUIT FOR LIQUID-CRYSTAL DISPLAYS AND LIQUID-CRYSTAL DISPLAY INCLUDING DRIVE CIRCUITS This is a divisional of application Ser. No. 09/037,544, filed Mar. 10, 1998 which is issued as U.S. Pat, No. 6,243,066 on Jun. 5, 2001.

BACKGROUND OF THE INVENTION

1. Field of the Invention

The present invention relates to a liquid-crystal display and its drive circuit and, more particularly, to a liquid-crystal display and a drive circuit suitable for a polycrystalline silicon liquid-crystal display (LCD) in which drive circuits are integrated over a wide area on a glass substrate.

2. Description of the Related Art

The present invention relates to a drive circuit for applying a voltage to liquid-crystal cells or to a data driver (which may be referred to as an address driver). Herein, a liquid-crystal display employing thin-film transistors (TFTs) will be used as an example. However, the present invention is not limited to this type of liquid-crystal display but can be applied to a data driver in any other type of liquid-crystal display.

According to a prior art, in a liquid-crystal display, cell electrodes and bus electrodes are formed on a glass substrate. A drive circuit is formed on an IC chip, and the IC chip is affixed to the glass substrate. Electrode pads on the IC chip and electrode pads on the glass substrate are linked by bonding wires. In this case, since a drive circuit is formed on a monocrystalline silicon substrate, complex circuitry can be designed. The liquid-crystal display of the prior art therefore includes two-stage of sample-and-hold circuits. While the first stages of sample-and-hold circuits are sampling display data, the second stages of sample-and-hold circuits provide outputs to be written. Data can therefore be written over nearly the whole display data hold period, and a driver of low driving ability can be used.

However, when an IC chip is affixed to a glass substrate and bonding wires are used for making electrical connections, it is difficult to attain sufficient productivity. This poses the problem of an increase in cost. For avoiding this kind of problem, a liquid-crystal display (LCD) using no IC chip such as a poly-crystalline silicon LCD in which a poly-crystalline silicon is used to form circuits directly in a wide area on a glass substrate has been devised. However, the poly-crystalline silicon LCD has a problem that it is more difficult to increase the density of devices to be integrated and stabilize the characteristics of the devices than it is when an IC chip is used. A data driver referred to as a point-sequential driving type data driver, using no sample-and-hold circuits, is employed.

A circuit employing a source-follower amplifier is widely used as a driver because of its simple circuitry. A buffer using a source-follower amplifier outputs a voltage produced by subtracting the threshold voltage of a transistor from an input voltage through the source-follower amplifier. However, there is a problem that the output voltage of the buffer is susceptible to the variation in the characteristic of a device, and changes along with the variation the characteristic. The same applies to a buffer using an operational amplifier. When a gradation level (voltage) must be written, there arises a problem that since an output voltage changes due to the variation in the characteristic of a device, irregular display occurs and display quality deteriorates.

Moreover, the buffer using an operational amplifier has another problem in that the circuitry is so complex as to increase the size of a driver.

The two problems are common to drive circuits for liquid-crystal displays. In particularly, for the poly-crystalline silicon LCD in which drive circuits are integrated over a wide area on a glass substrate, the problems are so critical as to dominate the possibility of attaining a larger screen or higher definition. There is therefore an increasing demand for a compact buffer not susceptible to the characteristics of a device and having simple circuitry.

Moreover, the point-sequential driving type data driver has the merits of having very simple circuitry and of minimizing a decrease in yield, and is therefore widely used for a poly-crystalline silicon LCD, used as a compact panel of up to 2 inches wide, for a projector. However, according to point-sequential driving method, a time interval usable for one writing is as short as several tens to several hundreds of nanoseconds. The data driver must apply a voltage representing data to a data bus for the short time interval. When the data driver is employed in a compact panel for a projector or the lake which is conformable to the Video Graphics Array (VGA) standard (640 by 480 pixels) stipulating a relatively low resolution, the capacitance of the data bus is very small and a time constant dependent on the capacitance and resistance of the data bus is very small. Therefore, display data Vdata can be input in a parallel form and the size of an analog switch can be optimized. However, when the data driver is employed in a direct-vision panel to be mounted in a notebook-sized personal computer and having a width of 10 inches or more, the area of a data bus is large. Therefore, the capacitance of the data bus is large, and the time constant is large. Consequently, the point-sequential driving type data driver fails to drive a data bus. Even if the data driver can drive a data bus, there arises a problem that the circuitry required will become unfeasibly large. When an attempt is made to realize a higher resolution, the crossings of wirings will increase. This poses a problem that the point-sequential driving fails to cope with the complex wirings.

As mentioned above, the point-sequential driving type data driver has its limitations in terms of a screen size and resolution. However, as far as the poly-crystalline silicon LCD is concerned, another driving method is unavailable. The foregoing problems are therefore critical problems dominating the possibility of realizing a larger screen or higher definition. There is therefore an increasing demand for a driving method making it possible to ensure a long writing time during which a voltage representing data is applied to a data bus despite small circuitry, and a drive circuit in which the driving method is implemented.

SUMMARY OF THE INVENTION

The first object of the present invention is to realize a buffer which is not susceptible to the characteristics of a device and having compact and simple circuitry. The second object of the present invention is to realize a driving method requiring little circuitry and making it possible to ensure a long writing time during which a voltage representing data is applied to a data bus, and a drive circuit in which the driving method can be implemented.

For accomplishing the first object, according to the first aspect of the present invention, a drive circuit for liquid-crystal displays includes an auxiliary capacitor. A first voltage is applied to a driving buffer, an output voltage of the buffer is temporarily accumulated in the auxiliary capacitor. A voltage produced by subtracting the voltage at the auxiliary capacitor from a second voltage is applied to the driving buffer, and an output of the driving buffer is applied to a data bus. Consequently, the threshold voltage of a transistor included in the driving buffer is canceled out by the output. A difference between the second voltage and first voltage is applied to the data bus, that is, a sampled capacitor. Thus, the output voltage is not susceptible to the uncertainty in the characteristic of a transistor.

To be more specific, according to the first aspect of the present invention, the drive circuit for liquid-crystal displays is a drive circuit for applying a voltage to display cells in a liquid-crystal display, and comprises a driving buffer for outputting a drive voltage to be applied to a display cell, a holding capacitor, and a switching circuit for switching a first state in which a first input voltage is applied to an input terminal of the driving buffer, a first terminal of the holding capacitor is connected to an output terminal of the driving buffer, and a second terminal of the holding capacitor is connected to a terminal at which a first given voltage exists, and a second state in which a second input voltage is applied to the first terminal of the holding capacitor, the input terminal of the driving buffer is connected to the second terminal of the holding capacitor, and a drive voltage is applied to a display cell through the output terminal of the driving buffer.

When the foregoing drive circuit is used to construct a data driver in a point-sequential driving type liquid-crystal display, display data is input as the first voltage, and a given voltage is input as the second input voltage. The switching circuit selects the first state during a display data hold period, and selects the second state during part or the whole of a horizontal retrace period.

Moreover, when sample-and-hold circuits for successively sampling display data are included in the data driver, an output of a sample-and-hold circuit is input as the first input voltage of the drive circuit, and the given voltage is input as the second input voltage. During part or the whole of the horizontal retrace period, the first state is selected. During the other periods, the second state is selected. In a variant, the drive circuit has the capability of a sample-and-hold circuit. A drive circuit to which an output of a sample-and-hold drive circuit is input is operated as a second drive circuit. The drive circuit having the capability of a sample-and-hold circuit inputs display data as the first input voltage, and inputs the given voltage as the second voltage. The switching circuit selects the first state during a display data hold period, and selects the second state during part or the whole of the horizontal retrace period. The second drive circuit inputs an output of the drive circuit having the capability of a sample-and-hold circuit as the first input voltage, and inputs the given voltage as the second input voltage. The switching circuit may select the first state during part or the whole of the horizontal retrace period, and select the second state during the other periods. On the contrary, an output of a sample-and-hold circuit may be input as the second input voltage and the given voltage may be input as the first input voltage. Even in this case, the threshold voltage of a transistor is canceled. The output voltage is therefore not susceptible to a uncertainty of the characteristic of a transistor.

It is well known that a voltage to be applied to a liquid crystal is reversed in polarity at intervals of a frame in an effort to prevent polarization of the liquid crystal. The present invention can be applied to this system. In this case, a positive voltage application period during which a positive voltage is applied to display cells and a negative voltage application period during which a negative voltage is applied are switched for each display frame. A gradation voltage representing a gradation level that is indicated by display data according to brightness of display is reversed in polarity between the positive voltage application period and negative voltage application period. Preferably, the magnitude of variation of the voltage is equalized between the positive voltage application period and negative voltage application period, and the second input voltage is made different between the positive voltage application period and negative voltage application period.

Moreover, display data may be a digital signal. In this case, latches for successively latching display data and D/A converters each converting an output of an associated latch into an analog signal are included. An output of a D/A converter is input as display data to the drive circuit.

For accomplishing the second object, according to the second aspect of the present invention, data buses in a liquid-crystal display are grouped into a plurality of blocks, and a data driver is segmented into a plurality of blocks accordingly. Each block includes a sample-and-hold circuit, a drive circuit, and a switch for isolating an output of the drive circuit from the data bus. Sample-and-hold and output can therefore be controlled block by block. Sample-and-hold and output are carried out at different time instants among the blocks. Each block can therefore hold display data until sampling is restarted after sampling is completed. When a scan pulse is output in the meantime, writing can be carried out. The timing of outputting a scan pulse is shifted so that the pulse duration of the scan pulse will substantially coincide with the display data hold periods used by the first block and last block. Writing is carried out during the coincident time interval. Consequently, a writing period can be extended even when only one set of sample-and-hold stages is employed. The writing period can be extended up to a sum of a half of a display data hold period and a horizontal retrace period.

To be more specific, according to the second aspect of the present invention, a liquid-crystal display is a liquid-crystal display having a display cell array in which a plurality of display cells are set in array, a scan driver for outputting a scan signal, and a data driver for outputting a drive voltage to be applied to the display cells. The data driver includes sample-and-hold circuits for successively sampling display data, a drive circuit segmented into a plurality of display blocks and allowing each display block to apply a voltage to a load including a display cell according to an output of an associated sample-and-hold circuit, and switches each isolating an output of a display block of the drive circuit from a load. During a period during which the scan driver outputs the scan signal, each display block applies the drive voltage to a load for a given period.

When the scan pulse is output with a delay of a half of the pulse duration of a signal representing display data after input of the display data, a writing period can be maximized.

Moreover, the scan driver may be installed on the right-hand and left-hand sides of the display cell array, and a plurality of scan blocks may be defined. The present invention can be adapted to this configuration. In this case, the timing of outputting a scan pulse is shifted scan block by scan block. This results in a longer writing period. For example, when the number of scan blocks is p, a scan pulse is preferably output to a q-th scan block with a delay of $(2(q-1)+1)/2p$ of the pulse duration of a signal representing display data after input of the display data.

Moreover, writing may be started during sampling. Therefore, a longer writing period can be ensured for display data sampled earlier by the same block. In this case, when sampling of display data has not been completed, display data concerning the preceding line is written. However, since the correct display data is sampled for a short period of time during which writing is not completed, no problem will occur.

Moreover, the rise time and the fall time of a scan pulse generally remain constant. However, the rise time may be delayed and the fall time may be advanced, whereby a selection period will get shorter.

Furthermore, for realizing the second object, according to the third aspect of the present invention, a drive circuit for liquid-crystal displays comprises a reference value generating circuit for generating a reference value that varies at intervals of a given cycle, a comparing circuit for comparing sampled display data with the reference value, a drive voltage generating circuit for generating a drive voltage that varies at intervals of a given cycle, and a switching circuit for controlling application of a drive voltage according to the result of comparison. The other circuits, including a sampling circuit, are separated from the drive voltage generating circuit and the switching circuit that require a high-grade driving ability, whereby the other circuits that are complex are reduced in size. This results in a compact drive circuit.

Specifically, according to the third aspect of the present invention, the drive circuit for liquid-crystal displays is a drive circuit for applying a voltage to display cells in a liquid-crystal display. The drive circuit comprises a sampling circuit for sampling and holding display data, a reference signal generating circuit for generating a reference signal that varies at intervals of a given cycle, a comparing circuit for comparing an output of the sampling circuit with a reference voltage and outputting a result of comparison, a drive voltage generating circuit for generating a drive voltage that varies at intervals of a given cycle, and a switch to be made to apply the drive voltage to an output terminal according to the output of the comparing circuit.

When the display data and the reference signal are analog signals, the sampling circuit includes an analog switch for sampling and a holding capacitor for sampling. The comparing circuit includes a sampling circuit for comparison composed of an analog switch for comparison and a holding capacitor for comparison, and a logic circuit. A reference signal is supplied, as a reference potential at the holding capacitor, for comparison. After the sampling circuit for comparison samples display data, the reference signal is varied. For example, the logic circuit in the comparing circuit is formed with an inverter, and the sampling circuit includes an analog buffer formed with a source-follower amplifier on the output stage.

During an initialization period preceding sampling of display data, the analog switch is made so that a given initialization voltage will be accumulated in the holding capacitor for sampling. Assuming that the threshold voltage of the logic circuit in the comparing circuit is Vtinv and a range of values in which the threshold voltage is uncertain in the course of manufacturing is ΔVtinv, an amplitude of display data representing one gradation level and an amplitude of the reference signal representing one gradation level must be equal to or larger than the range ΔVtinv.

Moreover, for compensating for the uncertainty of the threshold voltage of the comparing circuit, a holding capacitor for correction, and a switching circuit for switching a first state in which the holding capacitor for correction is connected between an output terminal of the switch and a terminal at which a first given voltage exists and a second state in which the holding capacitor is connected between the sampling circuit and comparing circuit. In the first state, the reference signal generating circuit outputs a reference signal that varies within the range of values in which the threshold voltage of the logic circuit included in the comparing circuit varies. The drive signal generating circuit outputs a signal that varies with the same amplitude as the reference signal, with an arbitrary voltage as a center, synchronously with the reference signal. In the second state, the reference signal generating circuit outputs a signal produced by adding the arbitrary voltage to the reference signal. The drive signal generating circuit outputs a drive signal. Preferably, within one horizontal synchronization period, after display data is sampled, the first state is established, and thereafter, the second state is established.

When the display data is a digital signal, the sampling circuit is a digital latch, and the comparing circuit is a digital comparing circuit. The reference signal generating circuit is a counter for generating a reference signal as a reference value. The digital comparing circuit is realized with a larger value judging circuit for judging which of display data and reference value is larger, or a consistency detecting circuit for judging whether or not the display data and reference value are mutually consistent. The digital latch is set or reset with an output of the larger value judging circuit or the consistency detecting circuit.

Moreover, the sampling circuit may be realized with a digital latch. The comparing circuit may be realized with a counter capable of being initialized, and accepts the reference signal as a counter operation control signal. After display data is set as an initial count value, counting may be carried out and a carry signal or a borrow signal may be output as a result of comparison.

In a liquid-crystal display in which the drive circuit in accordance with the third aspect of the present invention is used to construct a data driver and a voltage to be applied to a liquid crystal is reversed in polarity at intervals of a frame, a positive voltage application period during which a positive voltage is applied to display cells and a negative voltage application period during which a negative voltage is applied are switched for each display frame. A drive voltage is a signal symmetrical relative to a center level during both the positive voltage application period and negative voltage application period.

Moreover, the drive voltage may be varied non-linearly.

BRIEF DESCRIPTION OF THE DRAWINGS

The present invention will be more clearly understood from the description as set below with reference to the accompanying drawings, wherein:

FIG. 9 is a diagram showing drive waveforms in accordance with the first embodiment;

FIGS. 26A and 26B are diagrams showing drive waveforms in accordance with the eighth embodiment;

DESCRIPTION OF THE PREFERRED EMBODIMENTS

Before proceeding to a detailed description of the preferred embodiments, prior art drive circuits for liquid crystal displays will be described to allow a clearer understanding of the difference between the present invention and the prior art.

Figure 1:
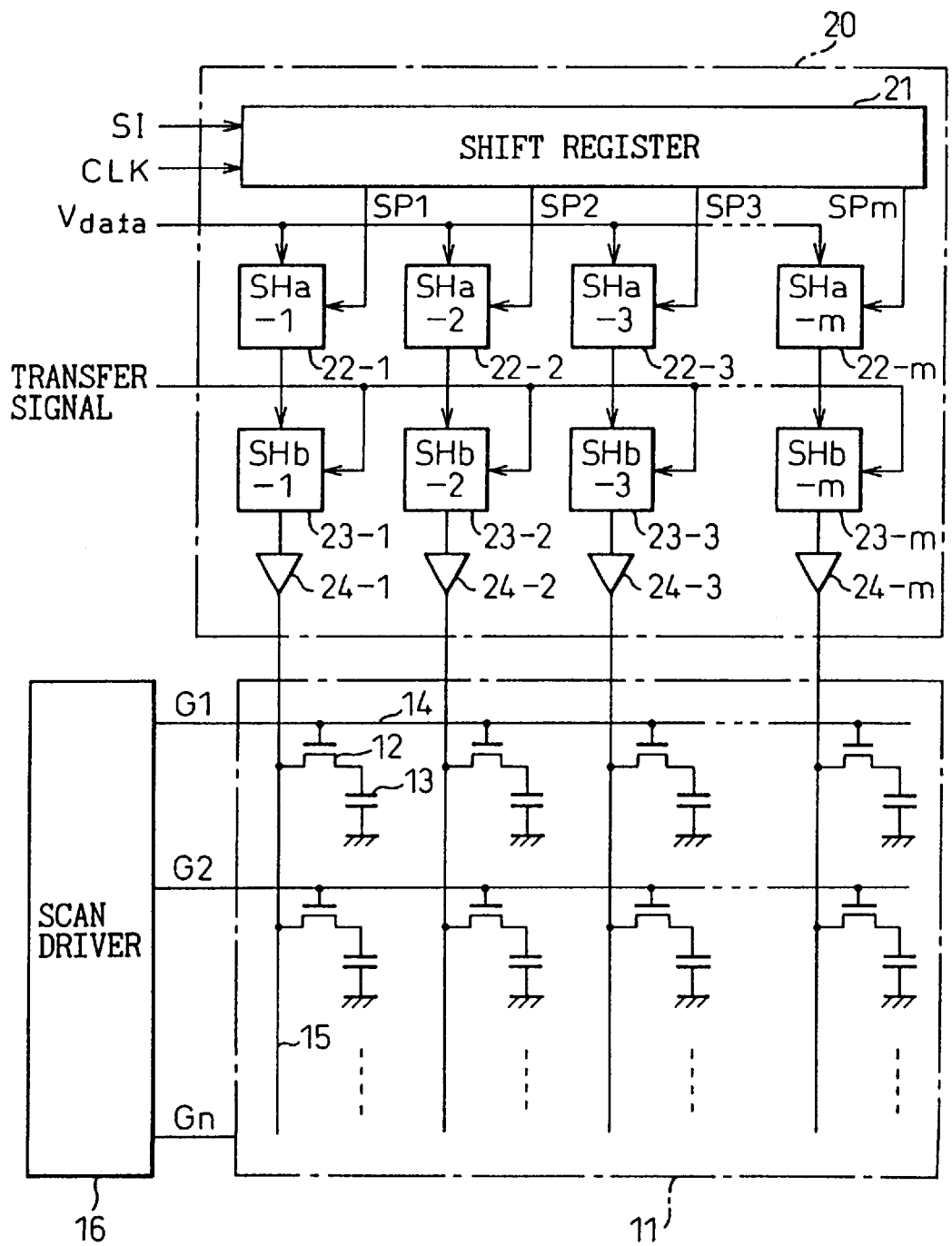
FIG. 1 is a diagram showing the configuration of a liquid-crystal display in accordance with a prior art.

FIG. 1 is a diagram showing a typical example of the configuration of a liquid-crystal display in accordance with a prior art. In FIG. 1, there are shown a liquid-crystal panel 11 having display cells 13, thin-film transistors (TFTs) 12, scan buses 14, and data buses 15. A scan driver 16 applies scan pulses G1, G2, etc., and Gn consecutively to the scan buses 14. A data driver 20 applies a data signal to the data buses 15. The data driver 20 includes a shift register 21 for sequentially shifting a pulse SI synchronously with a shift clock CLK and outputting selection pulses SP1, SP2, etc., and SPm, first sample-and-hold (S/Ha-1, etc., and S/Ha-m) circuits 22-1, 22-2, etc., and 22-m for successively sampling and holding display data Vdata synchronously with a selection pulse output from the shift register 21, second sample-and-hold (S/Hb-1, etc., and S/Hb-m) circuits 23-1, 23-2, etc., and 23-m for sampling and holding the display data Vdata held in the sample-and-hold circuits 22-1, 22-2, etc., and 22-m in response to a transfer signal, and buffers (drivers) 24-1, 24-2, etc., and 24-m for applying outputs of the second sample-and-hold circuits 23-1, 23-2, etc., and 23-m onto the data buses 15.

According to a display sequence employed in the liquid-crystal display, display data for one screen is input during one frame. The states of display cells on each display line are changed according to the display data and retained. The states of display cells on each display line of which data items have been rewritten are retained during one frame. After the frame time elapses, the states of the display cells are changed according to the next display data. Display data is input in units of a display line. A cycle during which display data for one display line is input is one horizontal synchronization period 1H. The horizontal synchronization period 1H is divided into a display data hold period during which display data is input and a horizontal retrace period thr during which no display data is input. This signaling system is adopted in order to make an output signal compatible with a video signal for a CRT.

Figure 2:
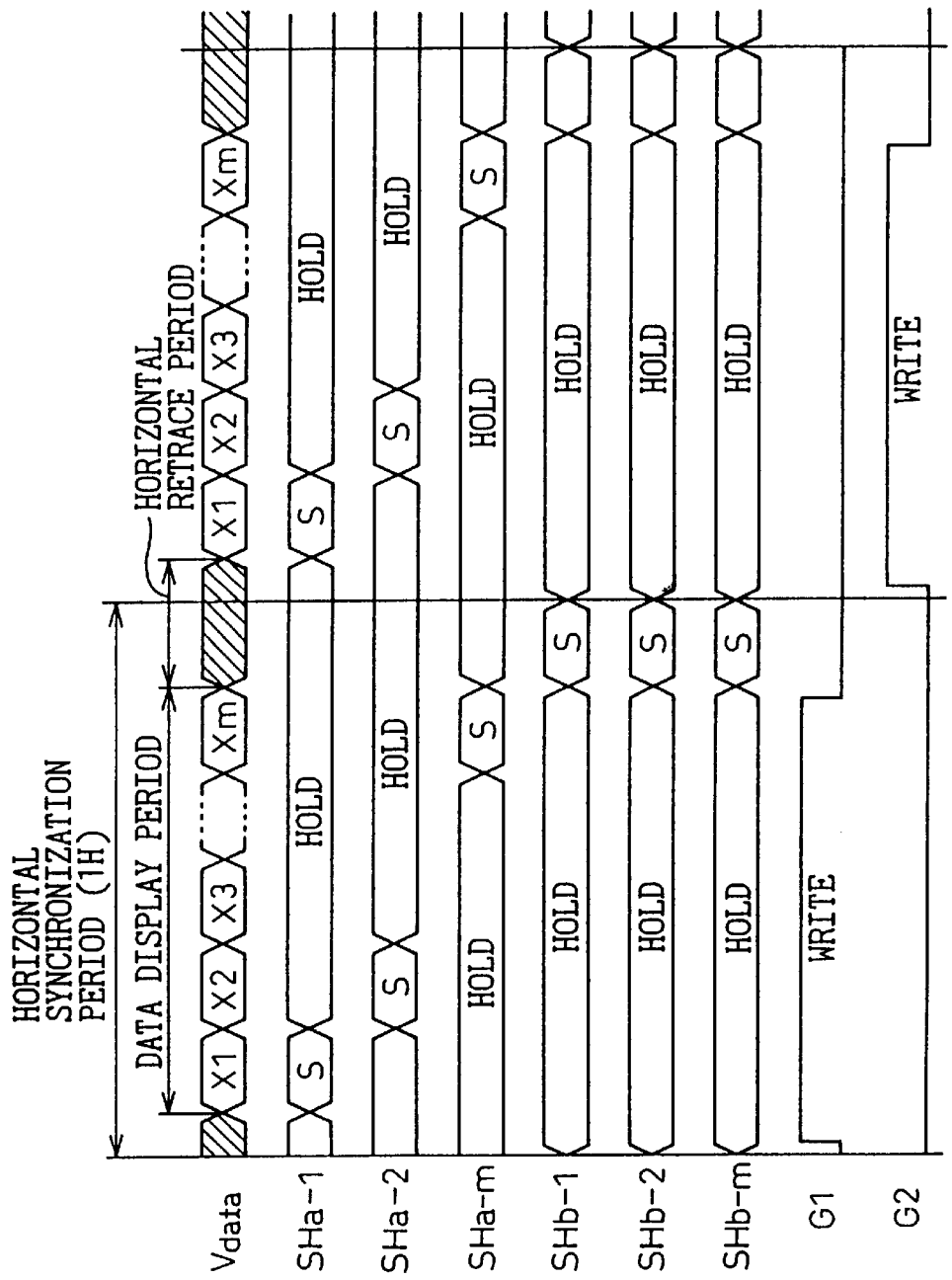
FIG. 2 is a diagram showing waveforms of drive signals employed in the liquid-crystal display in accordance with the prior art.

FIG. 2 is a timing chart showing drive waveforms to be applied during one horizontal synchronization period in the liquid-crystal display shown in FIG. 1.

As illustrated, during a display data hold period, data items x1, x2, etc., and xm are output successively as display data Vdata synchronously with a shift clock. The first sample-and-hold circuits 22-1, etc., and 22-m successively sample and hold the data items synchronously with a selection pulse sent from the shift register 21. When the display data hold period is completed, the first sample-and-hold circuits 22-1, etc., and 22-m hold the display data items x1, x2, etc., and xm. As soon as the display data period is completed, a transfer signal is output so that the display data items x1, x2, etc., and xm held by the first sample-and-hold circuits 22-1, etc., and 22-m will be transferred to the second sample-and-hold circuits 23-1, etc., and 23-m. The second sample-and-hold circuits 23-1, etc., and 23-m output the display data items x1, x2, etc., and xm that have been held by the sample-and-hold circuits until the next transfer signal is output. In the meantime, TFTs on the display line onto which a scan pulse is applied are turned on, and voltages representing the display data items and having been applied onto the data buses are applied to the associated display cells. The display cells are charged to the voltages proportional to the display data items. When application of the scan pulse is stopped, the TFTs on the line are turned off. The voltages proportional to the written display data items are held until the next display data is written. While the display data items output from the second sample-and-hold circuits 23-1, etc., and 23-m are output and written in the display cells, the first sample-and-hold circuits 22-1, etc., and 22-m successively sample and hold display data items concerning the next display line. As mentioned above, according to the configuration shown in FIG. 1, the sample-and-hold circuits are installed on two stages. While the sample-and-hold circuits on the preceding stage are sampling display data, the sample-and-hold circuits on the succeeding stage output display data to be written. Thus, writing can be carried out during nearly the whole the display data hold period.

Figure 3:
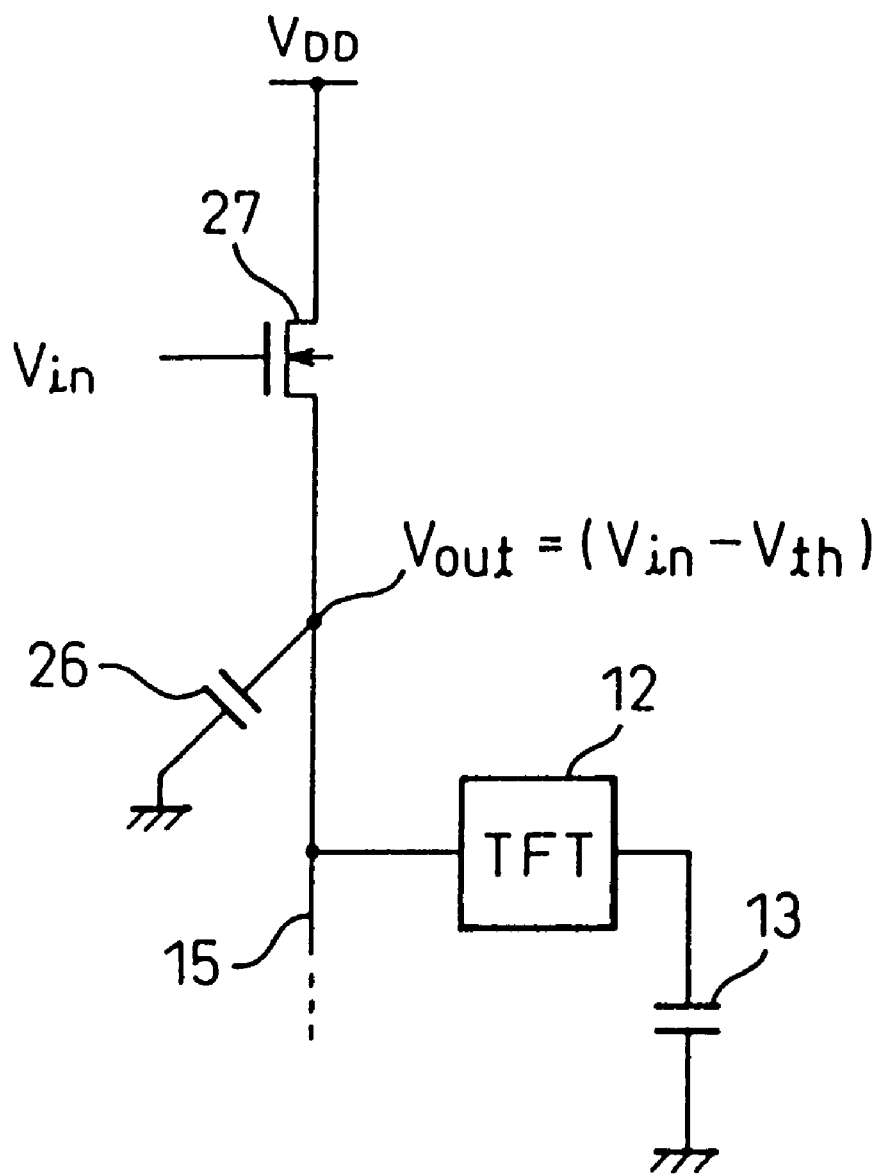
FIG. 3 is a diagram showing the configuration of a buffer in accordance with the prior art.

The buffers 24 in the data driver 20 totally represent buffers of the last stage for writing a data voltage into capacitive loads (charging the loads) and buffers of an output stage of data registers of a point-sequential driving type data driver, for applying a display data voltage to sampling capacitors in data latches (TFTs) succeeding the buffers. A buffer using an operational amplifier or source-follower amplifier is known. FIG. 3 shows the circuitry of a buffer for inputting display data held by a sample-and-hold circuit 23 as an input Vin through the gate of a transistor 27 and charging a capacitive load to a voltage Vout (=(Vdata−Vth), where Vth is the threshold voltage of the transistor 27) using a source-follower amplifier. Despite the simple circuitry, a high-grade driving ability (impedance transformation ability) can be realized. Reference numeral 26 denotes a load connected to each data bus, for example, a combination of a parasitic capacitance produced at an intersection between a data bus and scan bus and a parasitic capacitance produced between opposed electrodes via a liquid crystal on a data bus. The capacitive load CL is a combination of these capacitances and the capacitances into liquid-crystal elements.

As mentioned above, when an IC chip having a drive circuit formed on a monocrystalline silicon substrate is employed, circuitry having two stages of sample-and-hold circuits as shown in FIG. 1 is usable. However, when an IC chip is affixed to a glass substrate and electrical connections are made using bonding wires, it is difficult to attain sufficient productivity. This poses the problem of an increase in cost. To avoid this problem, an LCD using no IC chip, such as a poly-crystalline silicon LCD, has been devised. However, the poly-crystalline silicon LCD has a problem in that it is more difficult to increase the density of devices to be integrated and stabilize the characteristics of the devices than it is when an IC chip is used. In FIG. 1, the data driver includes the sample-and-hold circuits. A sample-and-hold circuit is a circuit that is hard to manufacture. A data driver referred to as a point-sequential driving type data driver using no sample-and-hold circuit has therefore been put to use.

Figure 4:
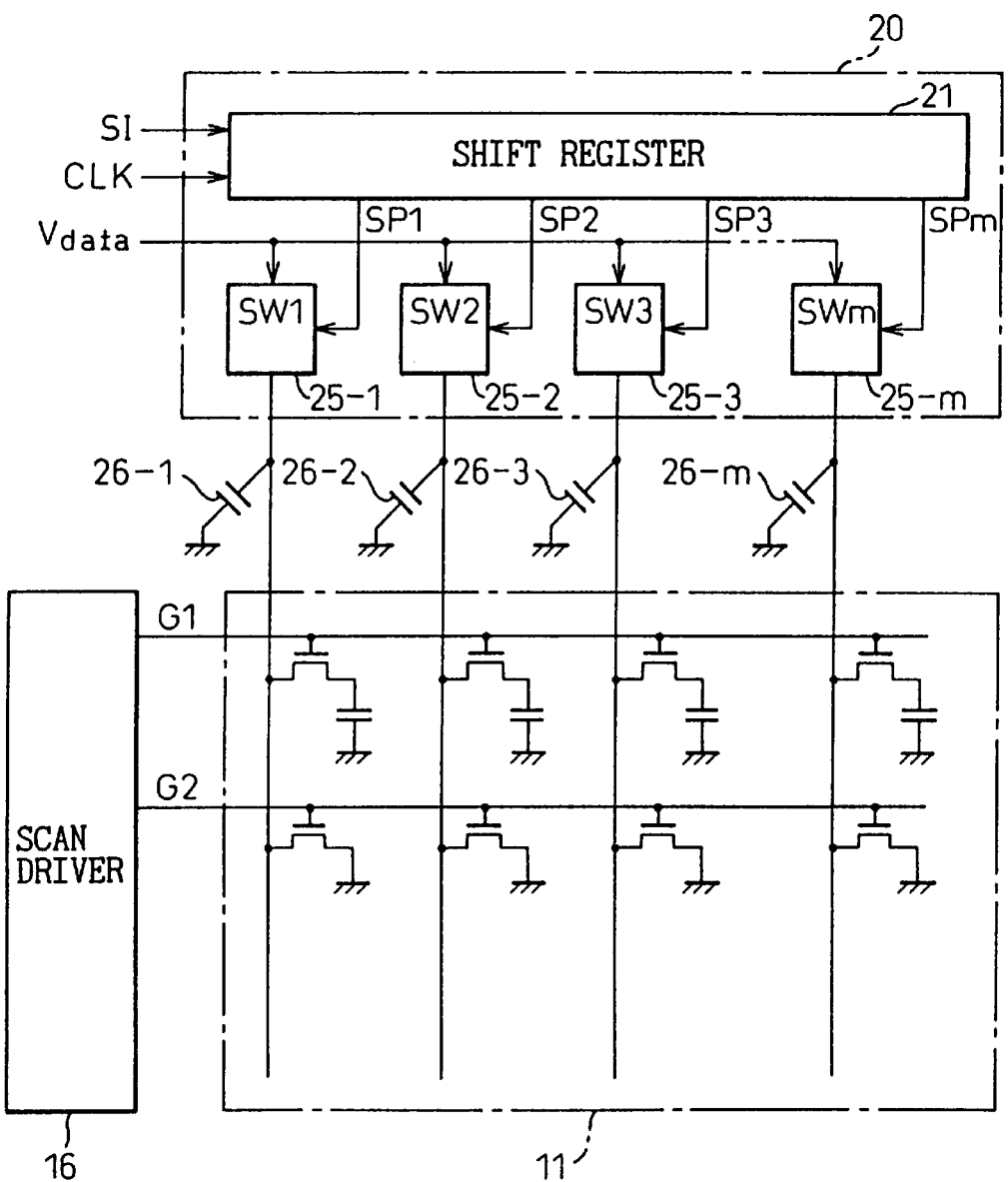
FIG. 4 is a diagram showing the configuration of a point-sequential driving type liquid-crystal display in accordance with a prior art.
Figure 5:
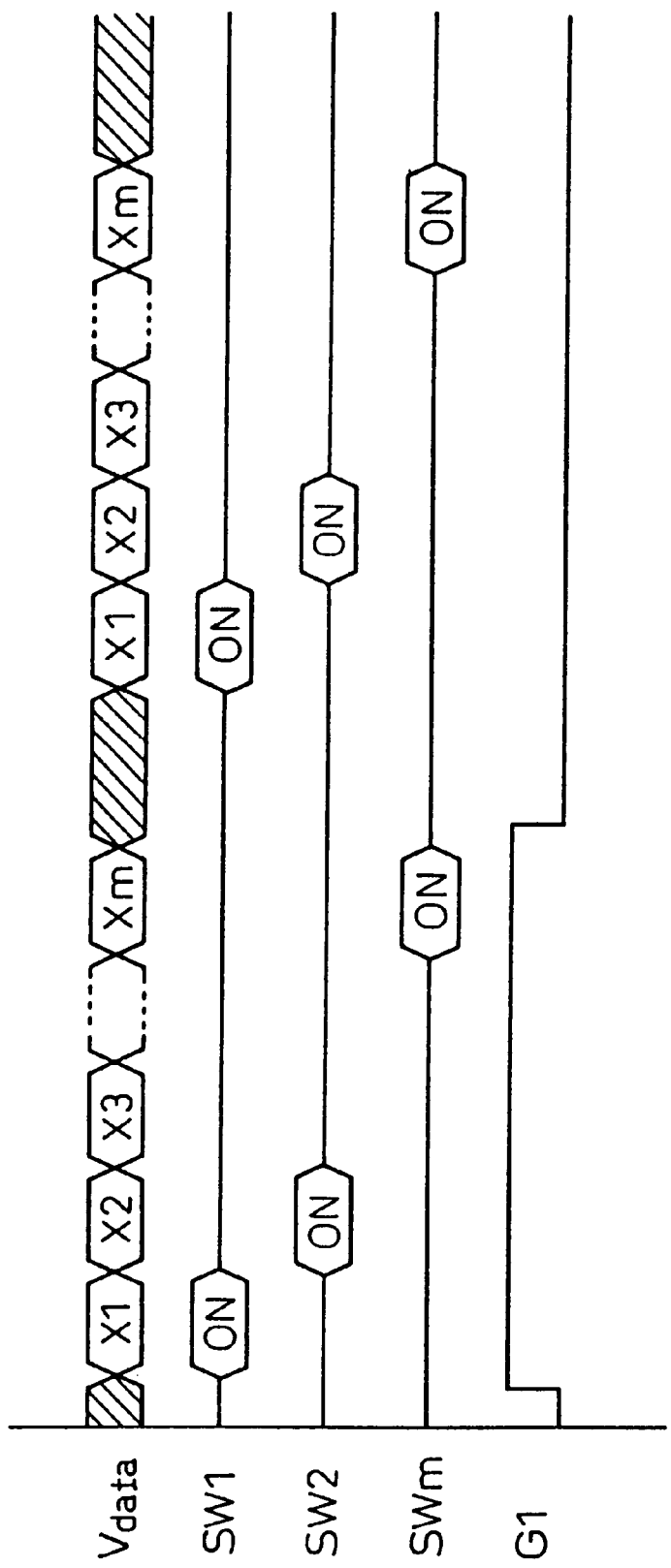
FIG. 5 is a diagram showing drive waveforms employed in the point-sequential driving technique.

FIG. 4 is a diagram showing the configuration of a liquid-crystal display using a point-sequential driving type data driver in accordance with a prior art. FIG. 5 is a diagram showing drive waveforms employed in the liquid-crystal display shown in FIG. 4.

As shown in FIG. 4, the point-sequential driving type data driver includes switches (SW) 25-1, 25-2, etc., and 25-m in place of the two stages of sample-and-hold circuits. In the point-sequential driving type liquid-crystal display shown in FIG. 4, as shown in FIG. 5, first, a scan driver 16 outputs scan pulses G1, G2, etc., and Gn successively. TFTs on a scan bus onto which the scan pulse is applied are turned on. This makes it possible to apply voltages on data buses to pixels (to charge the pixels). During a display data hold period, in a data driver 20, display data Vdata to be supplied in units of at least one dot is placed one after another on a display data input bus synchronously with a data clock CLK. A shift register 21 outputs a selection pulse SPm sequentially. An associated analog switch SWm is then turned on, and a voltage representing the display data Vdata is applied to a capacitive load CL. Reference numerals 26-1, 26-2, etc., and 26-m denote loads connected on the data buses. The load is, for example, a combination of a parasitic capacitance produced at an intersection between a data bus and scan bus and a parasitic capacitance produced between opposed electrodes via a liquid crystal on a data bus. The capacitive load CL is a combination of the parasitic capacitances and a capacitance that is in a liquid-crystal element. After the data driver 20 repeats writing during one horizontal scanning period (1H), the scan driver 16 stops applying a scan pulse. The TFTs on the scan buses are turned off, and the display data Vdata written in the pixels is held as it is. The display data Vdata is held during one frame during which the next scan pulse is applied to a scan bus.

The buffer using a source-follower amplifier shown in FIG. 3 has a problem that an output voltage changes with the variation in a characteristic. The same applies to a buffer using an operational amplifier. The buffer using an operational amplifier has another problem that the circuitry is complex and a driver becomes larger in size.

The point-sequential driving type data driver shown in FIG. 4 has the merits of having very simple circuitry and minimizes a decrease in yield. According to point-sequential driving, however, there is a problem that the time usable for one writing is as short as several tens to several hundreds of nanoseconds.

Figure 6:
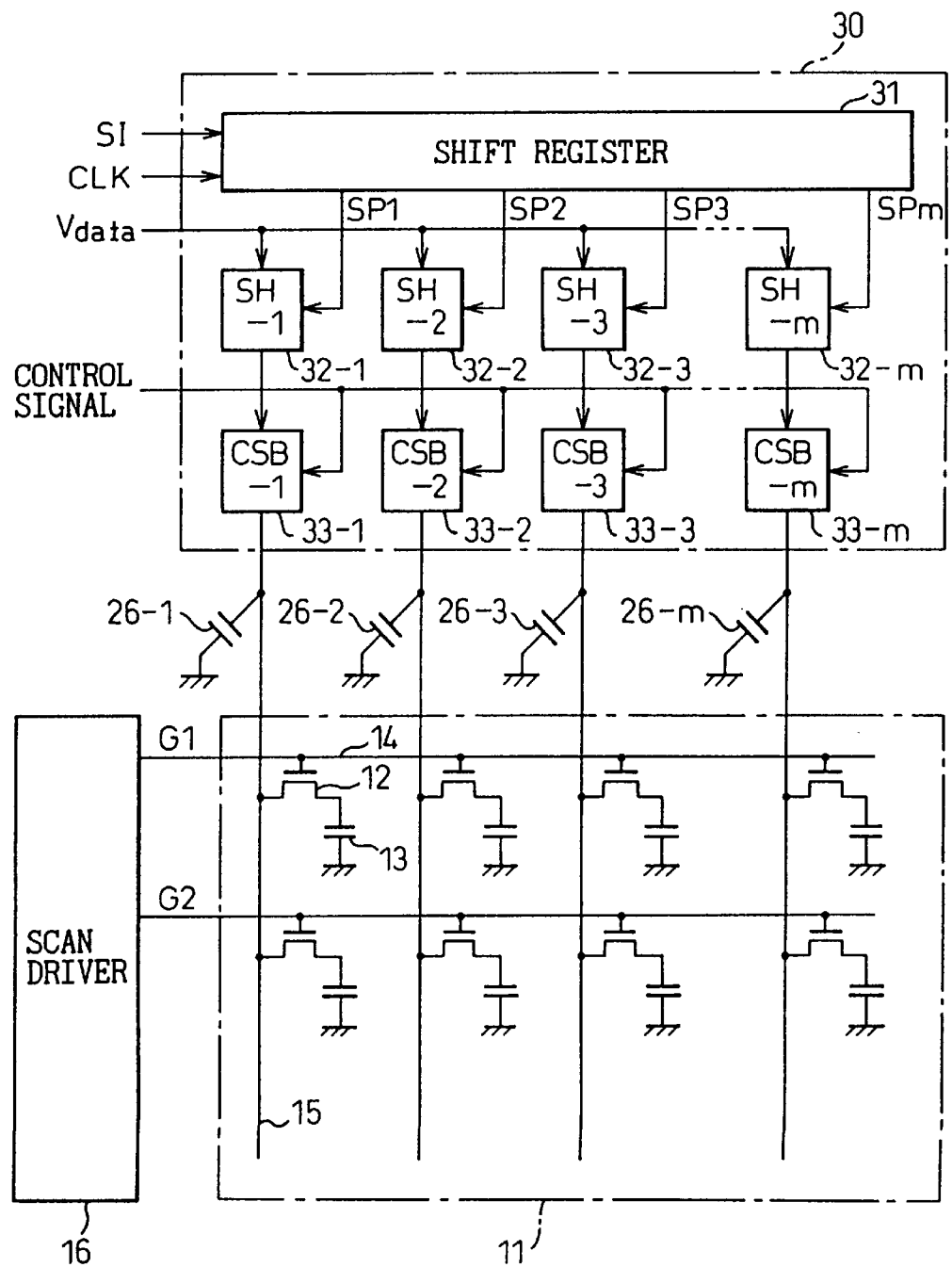
FIG. 6 is a diagram showing the configuration of a liquid-crystal display in accordance with the first embodiment.

FIG. 6 is a diagram showing the configuration of a liquid-crystal display (poly-crystalline silicon LCD) having a drive circuit, which is made of a poly-crystalline silicon and in which the first aspect of the present invention is implemented in a data driver, in accordance with the first embodiment. The liquid-crystal display of the first embodiment has, as shown in FIG. 6, the same configuration as the liquid-crystal display of the prior art except a data driver 30. The data driver 30 includes a shift register 31 that operates with inputs of a sampling pulse S1 and shift clock CLK, sample-and-hold circuits 32-1, etc., and 32-m for sampling and holding display data Vdata according to sampling pulses SP1, etc., and SPm output from the shift register 31, and compensation sampling buffers (CSB) 33-1, etc., and 33-m for latching and outputting outputs of the sample-and-hold circuits in response to a control signal and driving capacitive loads. The shift register 31 and sample-and-hold circuits 32-1, etc., and 32-m except the compensation sampling buffers (CSB) 33-1, etc., and 33-m are identical to those in accordance with the prior art shown in FIG. 1.

Figure 7A:
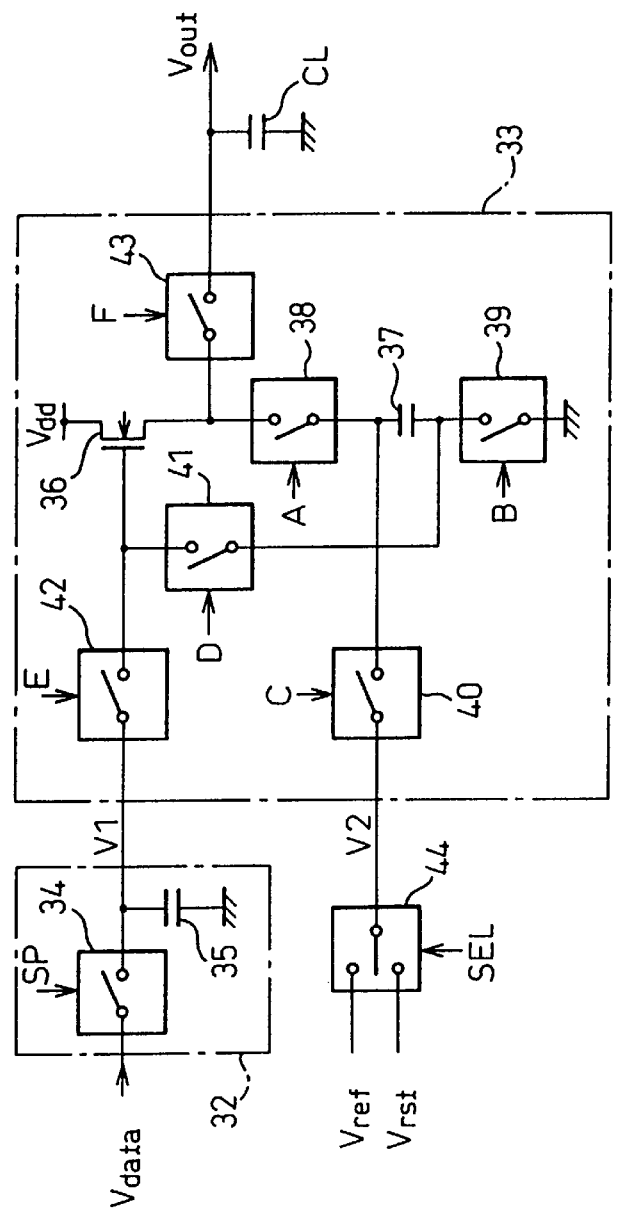
FIGS. 7A and 7B are diagrams showing the circuitry of a compensation sampling buffer (CSB) in accordance with the first embodiment.
Figure 7B:
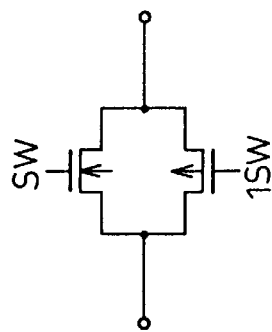

FIG. 7A is a diagram showing the circuitry of a compensation sampling buffer (CSB) in accordance with the first embodiment, wherein a sample-and-hold circuit (S/H) 32 is also shown. As shown in FIG. 7A, the S/H circuit 32 includes an analog switch 34 and sampling capacitor 35, holds data Vdata in the sampling capacitor 35 in response to a sampling pulse SP, and outputs the data in the form of a voltage V1 to the CSB 33. An analog switch 44 selects a reference voltage Vref or reset voltage Vrst and outputs the voltage as a voltage V2 to the CSB 33. The CSB 33 is a buffer using a source-follower amplifier that includes a transistor 36, and uses analog switches 38 to 42, which are controlled with control signals A to E, to switch connections with a holding capacitor 37. Owing to an analog switch 43 controlled by a signal F, it can be controlled whether or not an output of the buffer should be output to a capacitive load CL. Furthermore, the analog switches 38 to 42 are, as shown in FIG. 7B, each made by connecting p-type and n-type transistors in parallel with each other. The gate capacitances of the transistors are generally equalized. The control signals A to E are applied to the gates of the n-type transistors, and signals whose polarities are opposite to those of the control signals A to E are applied to the gates of the p-type transistors.

Figure 8A:
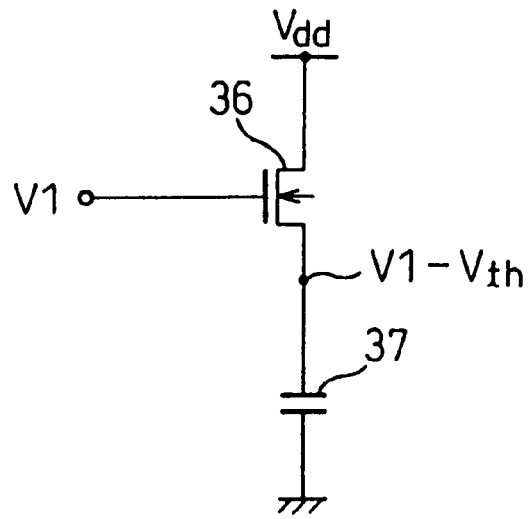
FIGS. 8A and 8B are diagrams for explaining the operation of the CSB in accordance with the first embodiment.
Figure 8B:
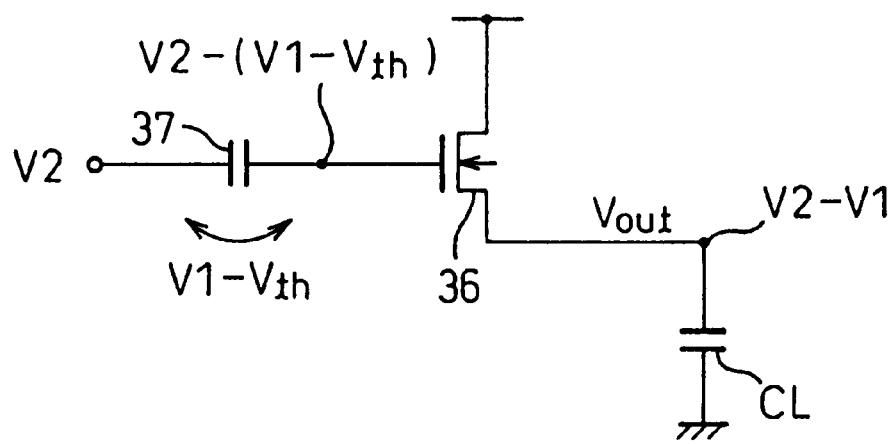

FIGS. 8A and 8B are diagrams for explaining the operation of the CSB shown in FIG. 7. Referring to FIGS. 8A and 8B, the principles of operation of the CSB circuit will be described. The control signals A, B, and E are driven high in order to turn on (make) the analog switches 38, 39, and 42. The control signals C, D, and F are driven low in order to turn off (break) the analog switches 40, 41, and 43. This brings the circuit shown in FIG. 7A to a state shown in FIG. 8A. When the control signals A, B, and E are driven low in order to turn off the analog switches 38, 29, and 42, and the control signals C, D, and F are driven high in order to turn on the analog switches 40, 41, and 43, the circuit shown in FIG. 7 is brought into a state shown in FIG. 8B. Assuming that the threshold voltage of the transistor 36 is Vth, in a first state, the transistor 36 outputs a voltage V1−Vth, and the holding capacitor 37 is charged with the voltage. This operation shall be referred to as latching. When the first state is switched to the second state, a voltage V2−(V1−Vth) is applied to the gate of the transistor 36. A voltage V2−V1 is output. The capacitive load CL is charged with the voltage. This operation shall be referred to as writing. Thus, the threshold voltage Vth of the transistor 36 is canceled, and a voltage to be applied to the capacitive load CL is not affected by the threshold voltage Vth of the transistor 36. Consequently, a constant voltage can always be applied to the capacitive load CL irrespective of the uncertainty of the threshold voltage Vth of the transistor 36. As illustrated, the source-follower amplifier has simple circuitry but conventionally has a problem that an output voltage becomes uncertain because of the uncertainty of the threshold voltage of a transistor. By implementing the present invention, a buffer having compact circuitry and providing a constant output voltage can be realized.

FIG. 9 is a diagram showing drive waveforms in accordance with the first embodiment. The S/H circuits 32-1 to 32-m each sample and hold display data Vdata in response to a sampling pulse output from the shift register 31 during a display data hold period. The sampled data Vdata is held until the next display data Vdata is sampled.

During the first half of a horizontal retrace period, the control signals A, B, C, D, and F are driven high, and the control signal E is driven low. In the CSBs 33-1 to 33-m, the analog switches 38 to 40, 41, and 43 are turned on, and the analog switches 42 are turned off. At this time, the analog switches 44 select the reset voltage Vrst (for example, 0 V), and the holding capacitors 37, gates of the transistors 36, and capacitive loads CL are reset.

During the second half of the horizontal retrace period, the control signals A, B, and E are driven high, and the control signals C, D, and F are driven low. The CSBs are brought to the state shown in FIG. 8A. The holding capacitors 37 are each charged with a voltage V1−Vth produced by subtracting the threshold voltage of the transistor 36 from the display data Vdata concerning a display line and held in each of the S/H circuits 32-1 to 32-m. This means that the display data Vdata held in the S/H circuits 32-1 to 32-m is transferred to the CSB circuits 33-1, etc., and 33-m and then latched.

During a display data hold period, the control signals A, B, and E are driven low, and the control signals C, D, and F are driven high. The analog switches 44 select the reference voltage Vref. Since a scan pulse Gn is output, the CSBs are brought to the state shown in FIG. 8B. A voltage V2−V1 is then applied to liquid-crystal elements lying on a scan bus onto which the scan pulse Gn is applied.

Figure 10A:
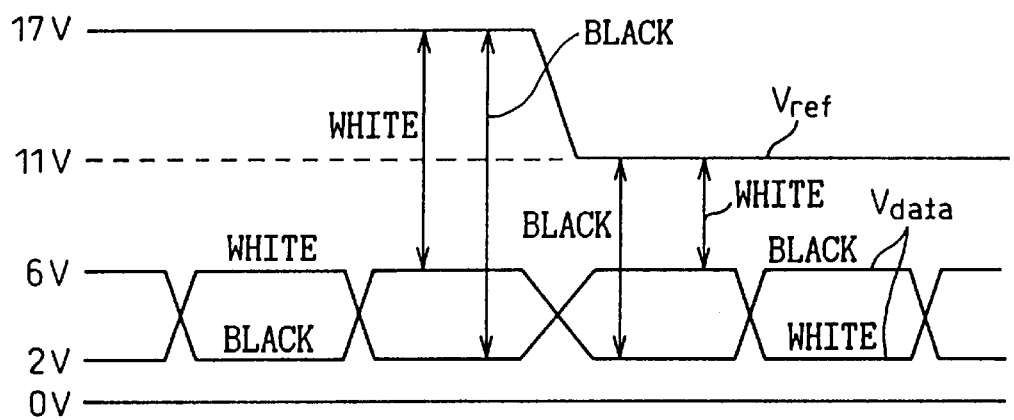
FIGS. 10A and 10B are diagrams for explaining display data voltage control in accordance with the first embodiment.
Figure 10B:
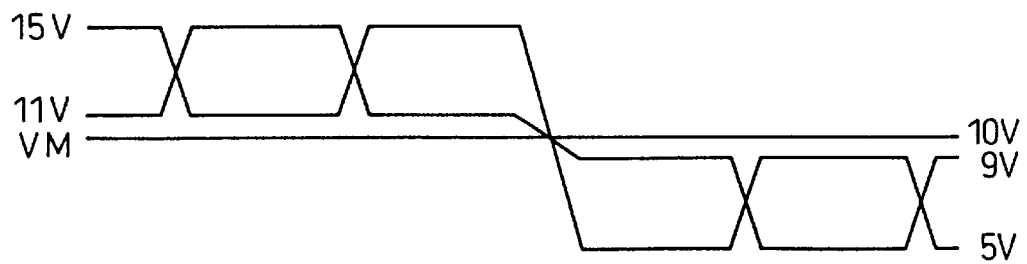

FIGS. 10A and 10B are diagrams for explaining control of a voltage representing display data in accordance with the first embodiment. As shown in FIG. 10A, the reference voltage Vref varies between 17 V and 11 V at intervals of a frame. Data Vdata is 6 V for a white display and 2 V for a black display. For an intermediate gradation level, the data Vdata has an intermediate value. For a white display, a voltage to be applied to each capacitive load CL, that is, each liquid-crystal element varies, as shown in FIG. 10B, between 11 V and 9 V at intervals of a frame. For black display, the voltage varies between 15 V and 5 V at intervals of a frame. When the potential at a common electrode opposed to a pixel electrode is set to 10 V, the voltage applied to the liquid-crystal element varies between 1 V and −1 V at intervals of a frame for white display, and varies between 5 V and −5 V for black display. Thus, in the first embodiment, the data Vdata has a constant voltage of 6 V for white display irrespective of a frame, and a constant voltage of 2 V for black display. The amplitude of the data Vdata is 4 V. Nevertheless, voltages of opposite polarities are applied to the liquid-crystal elements during adjoining frames. The amplitude of the voltages is 10 V for black display. Consequently, the supply voltages of an external circuit for generating data Vdata or the S/H circuits and peripheral circuits can be lowered. This results in a minimized power consumption and improved reliability.

As mentioned above, in the liquid-crystal display according to the first embodiment, the data driver is not susceptible to the variation in the characteristic of a transistor included in a buffer. Consequently, the display quality of the polycrystalline silicon LCD can be improved. Moreover, the compensation sampling buffers (CSB) each have the capability of a sample-and-hold circuit and can therefore be substituted for one of the conventionally-required two stages of sample-and-hold circuits. The circuitry does not become very large. Besides, line-sequential driving according to which the time required for writing can be equalized substantially with one horizontal scanning period (1H) can be adopted. An analog switch can be made smaller in size, and thus the circuit can be designed compactly.

Figure 11:
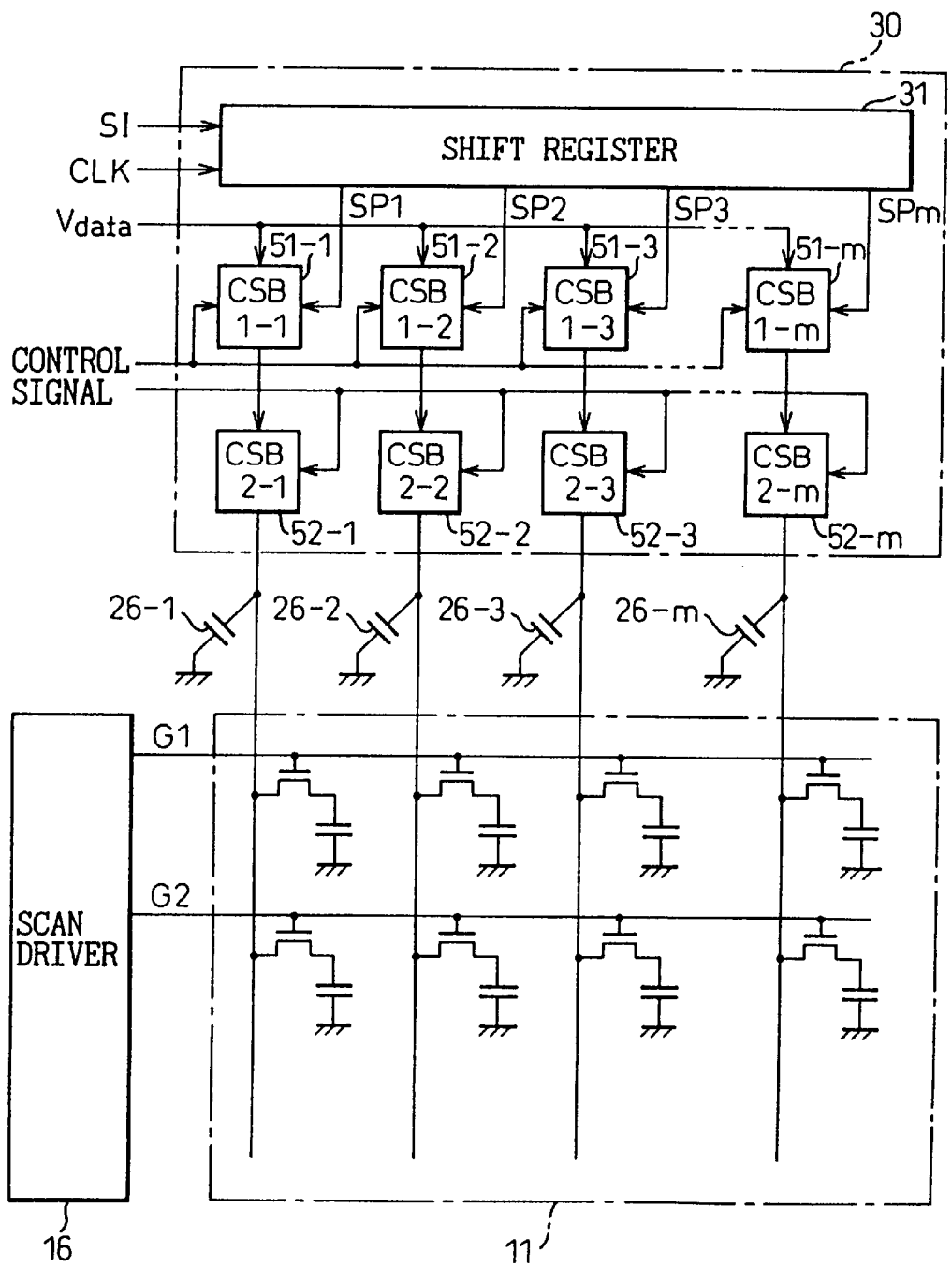
FIG. 11 is a diagram showing the configuration of a liquid-crystal display in accordance with the second embodiment.

FIG. 11 is a diagram showing the configuration of a liquid-crystal display in accordance with the second embodiment. In the second embodiment, compensation sampling buffers (CSB) are substituted for the sample-and-hold circuits 32-1 to 32-m employed in the first embodiment. This is different from the first embodiment.

Figure 12:
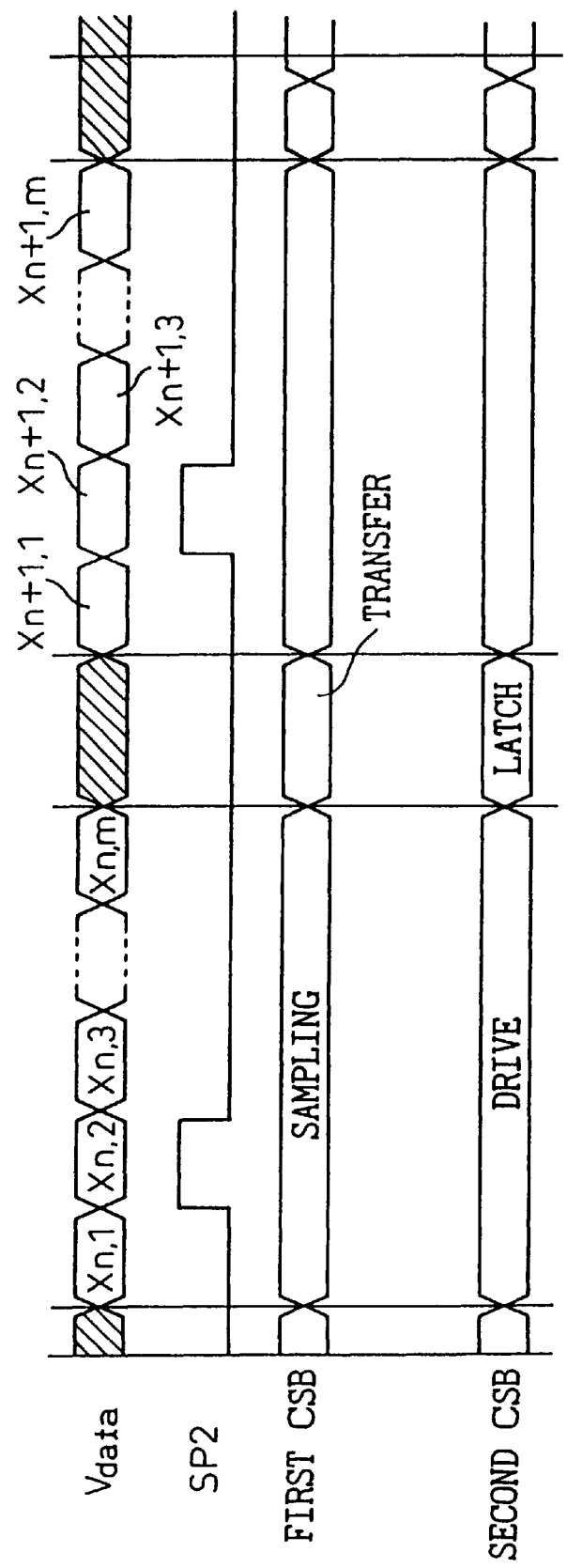
FIG. 12 is a diagram showing operations in accordance with the second embodiment.

FIG. 12 is a diagram showing drive waveforms in accordance with the second embodiment. First compensation sampling buffers (CSB1-1 to CSB1-m) 51-1 to 51-m are brought to the first state shown in FIG. 8A in response to the sampling pulses SP1 to SPm. Display data Vdata is latched by the holding capacitors 37. The latched data Vdata is held until the next display data is latched. Thus, display data Vdata concerning one display line is latched by the first compensation sampling buffers CSB1-1 to CSB1-m during a display data hold period. The latched display data Vdata concerning one display line is transferred to the second compensation sampling buffers (CSB2-1 to CSB2-m) 52-1 to 52-m during a horizontal retrace period. The first compensation sampling buffers CSB1-1 to CSB1-m work in the same manner as the sample-and-hold circuits. The second compensation sampling buffers CSB2-1 to CSB2m latch the display data Vdata concerning one display line and having been held in the first compensation sampling buffers CSBs 1-1 to 1-m during the horizontal retrace period, and write the display data in the loads during a display data hold period.

The compensation sampling buffers (CSBs) are substituted for the sample-and-hold circuits. The voltages to be retained in the first CSBs will therefore not be dominated by the capacities of the second CSBs. Besides, the necessity of resetting the holding capacitors in the second CSBs is obviated.

Figure 13:
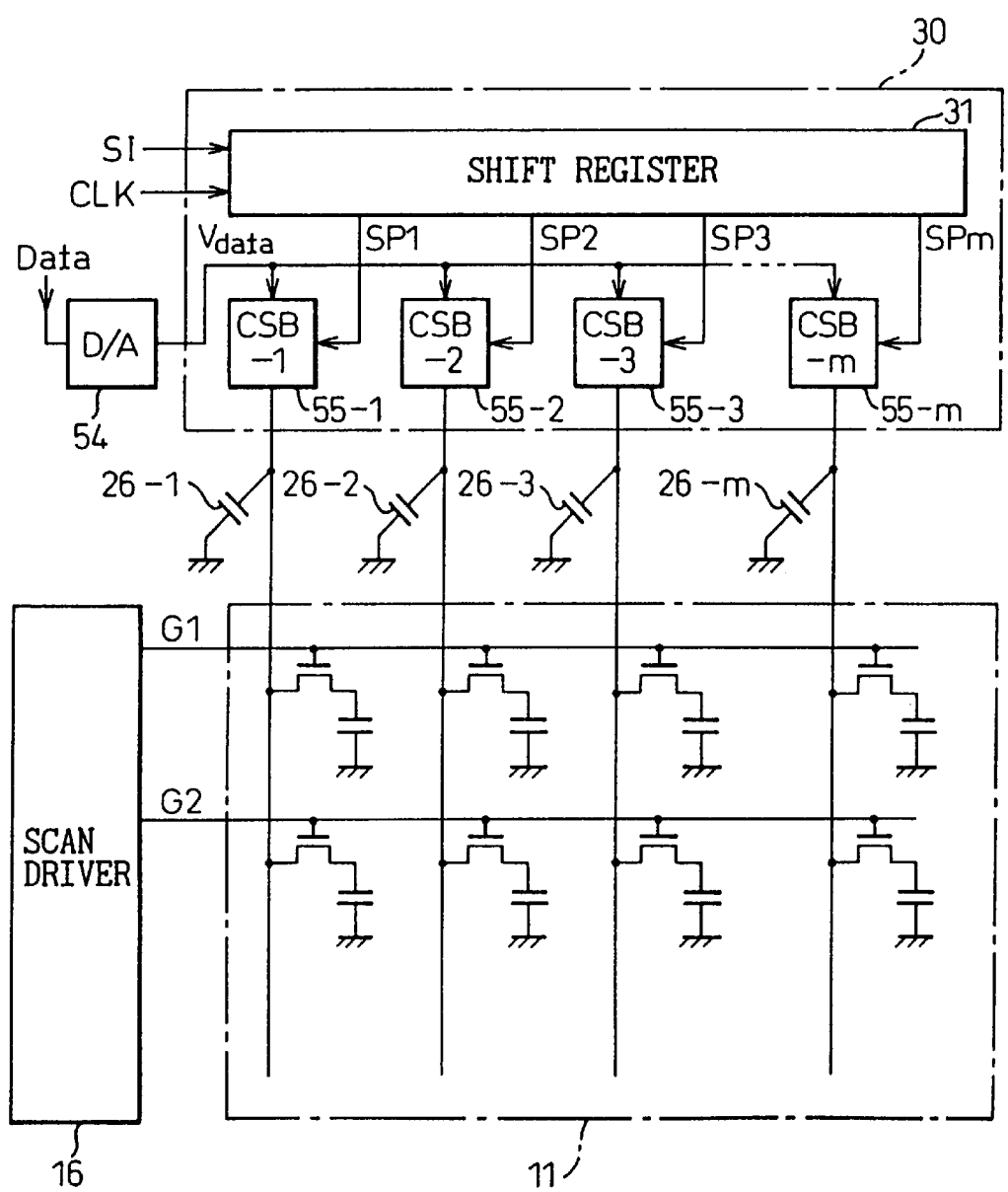
FIG. 13 is a diagram showing the configuration of a liquid-crystal display in accordance with the third embodiment.

FIG. 13 is a diagram showing the configuration of a liquid-crystal display in accordance with the third embodiment. In the third embodiment, the sample-and-hold circuits 32-1 to 32-m employed in the first embodiment are excluded. Display data Vdata is input directly to the compensation sampling buffers (CSB-1 to CSB-m) 55-1 to 55-m. Latching operations in the compensation sampling buffers CSB-1 to CSB-m are carried out successively and synchronously with the sampling pulses Sp1 to SPm. Writing is then carried out during a horizontal retrace period (or at the completion of latching). In the third embodiment, display data is digital data Data. After being converted into analog data Vdata by a D/A converter 54, the display data is supplied to the compensation sampling buffers (CSBs).

Figure 14:
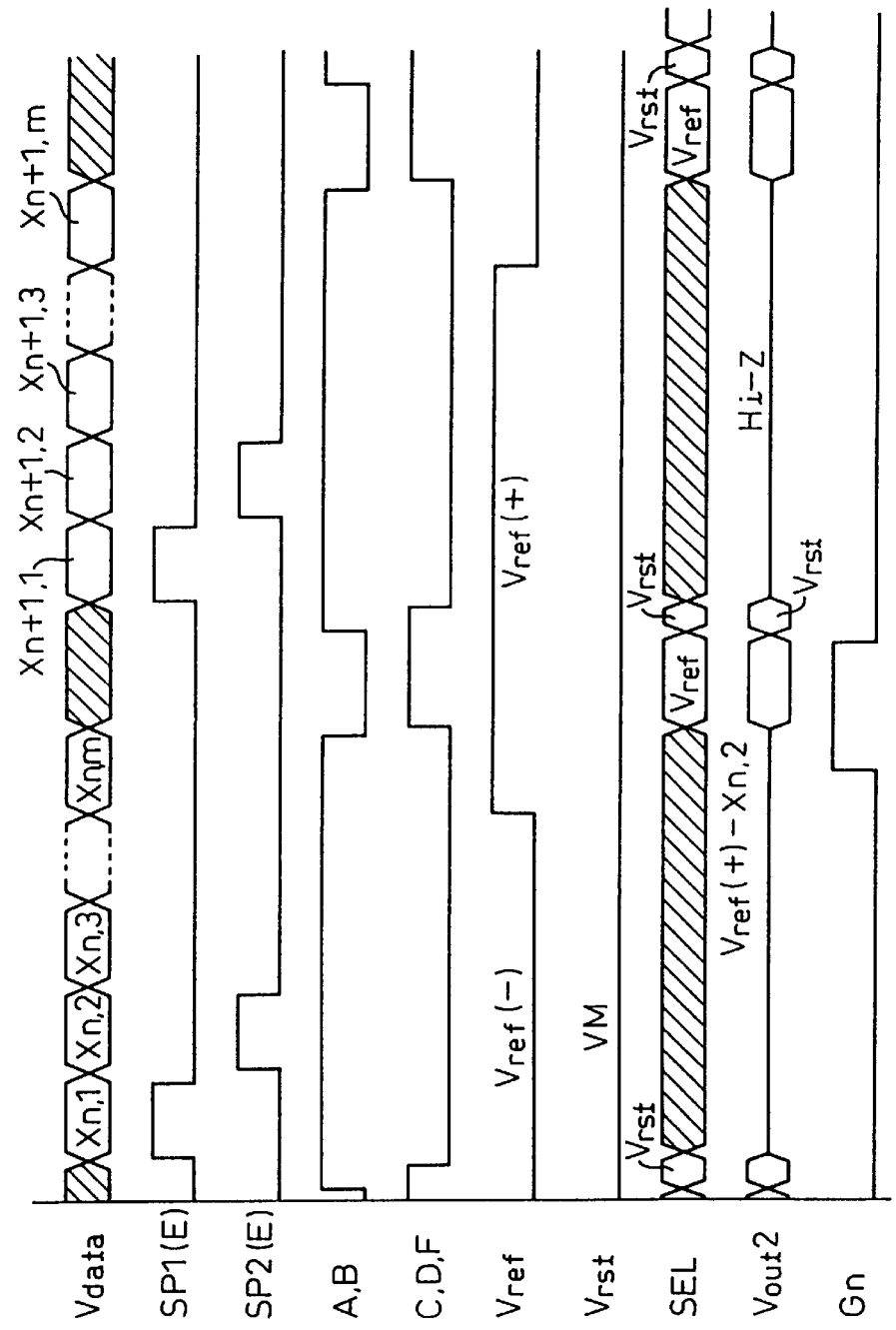
FIG. 14 is a diagram showing drive waveforms in accordance with the third embodiment.

FIG. 14 is a diagram showing drive waveforms in accordance with the third embodiment. During a display data hold period, the control signals A and B in each compensation sampling buffer (CSB) are driven high, and the control signals C, D, and F are driven low. When the sampling pulses SP1 to SPm are input as the control signal E, the CSBs are brought into the state shown in FIG. 8A. Display data Vdata is latched in the holding capacitors 37. When the sampling pulses are not input, held display data Vdata is retained as it is. When display data Vdata concerning one line is latched, the control signals A and B are driven low and the control signals C, D, and F are driven high. Since the control signal E remains low, as soon as the CSBs are brought into the state shown in FIG. 8B, a scan pulse Gn is applied. The display data is then written in the capacitive loads CL. When writing is completed, application of the scan pulse Gn is stopped. The analog switches 44 output the reset voltage Vrst. After the CSBs are reset, latching of display data Vdata is restarted.

Figure 15:
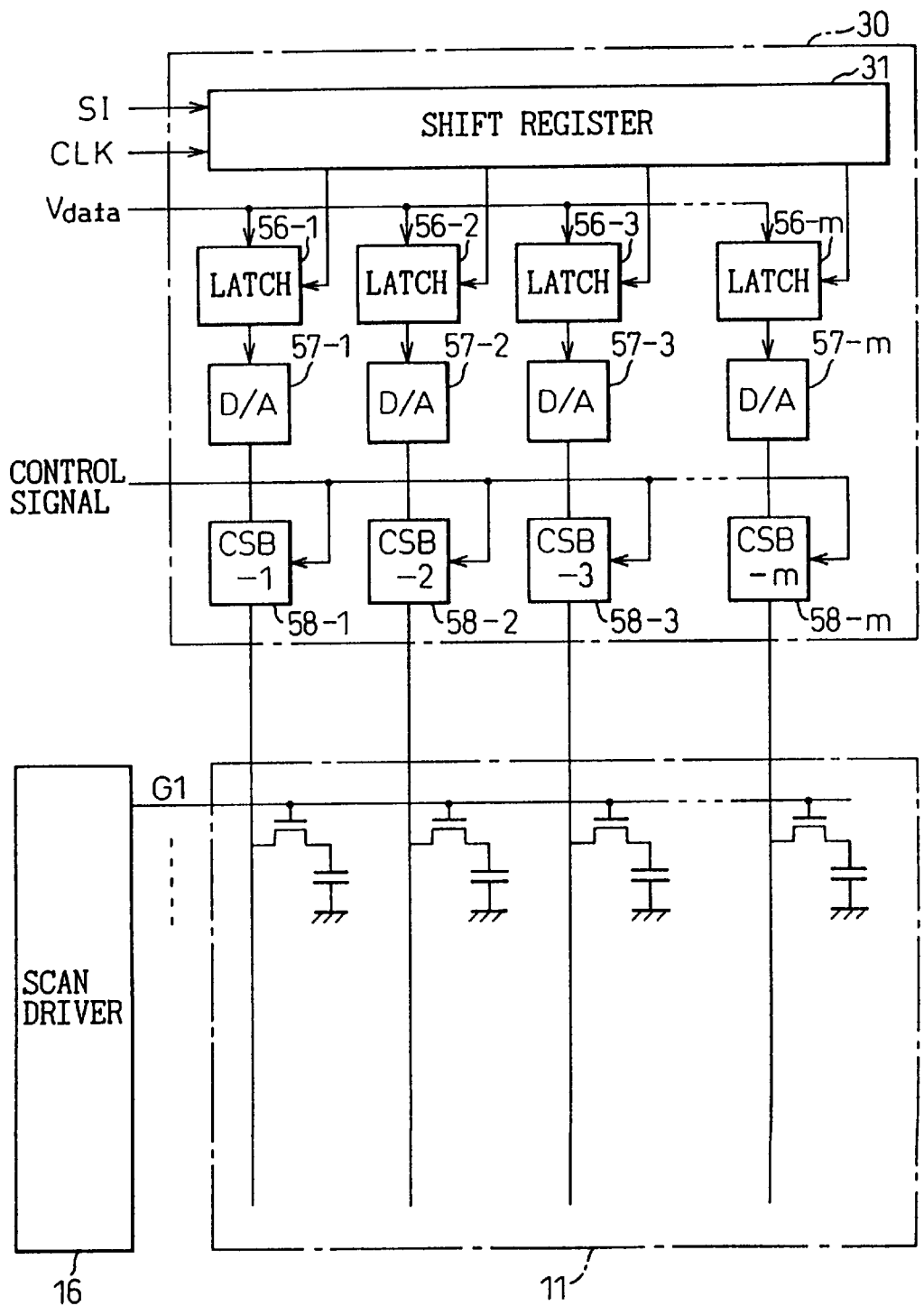
FIG. 15 is a diagram showing the configuration of a liquid-crystal display in accordance with the fourth embodiment.

FIG. 15 is a diagram showing the configuration of a liquid-crystal display in accordance with the fourth embodiment. In the fourth embodiment, display data is digital data Data. Digital latches 56-1 to 56-m and D/A converters 57-1 to 57-m are substituted for the sample-and-hold circuits 32-1 to 32-m employed in the first embodiment. The other components are identical to those in the first embodiment. Since compensation sampling buffers are used as buffers, output voltages are, like those in the first embodiment, each not susceptible to the variation in the characteristic of a transistor.

When the configuration in accordance with the third or fourth embodiment is adopted, a digital interface data driver can be constituted. A liquid-crystal display including such a data driver will be better matched with a personal computer for handling image information in the form of digital data.

The first to fourth embodiments have been described by taking a circuit, in which display data Vdata is input as a voltage V1 to be applied to CSBs, as an example. The display data Vdata may be regarded as a voltage V2, and a given voltage Vref may be input as the voltage V1. However, in the second and third embodiments, circuits for holding display data must be installed at a stage preceding the CSBs. In any case, the variation of an output of each buffer can be corrected and the adverse effect of the characteristic of each transistor can be eliminated. Consequently, a polycrystalline silicon LCD can be realized as a liquid-crystal display offering high display quality. Moreover, the circuitry of the LCD can be reduced in size. When display data and a given voltage are controlled at every switching of a positive voltage period and negative voltage period (reversal of an alternating voltage), the supply voltage of a drive circuit can be lowered. This results in a minimized power consumption and improved reliability.

Figure 16A:
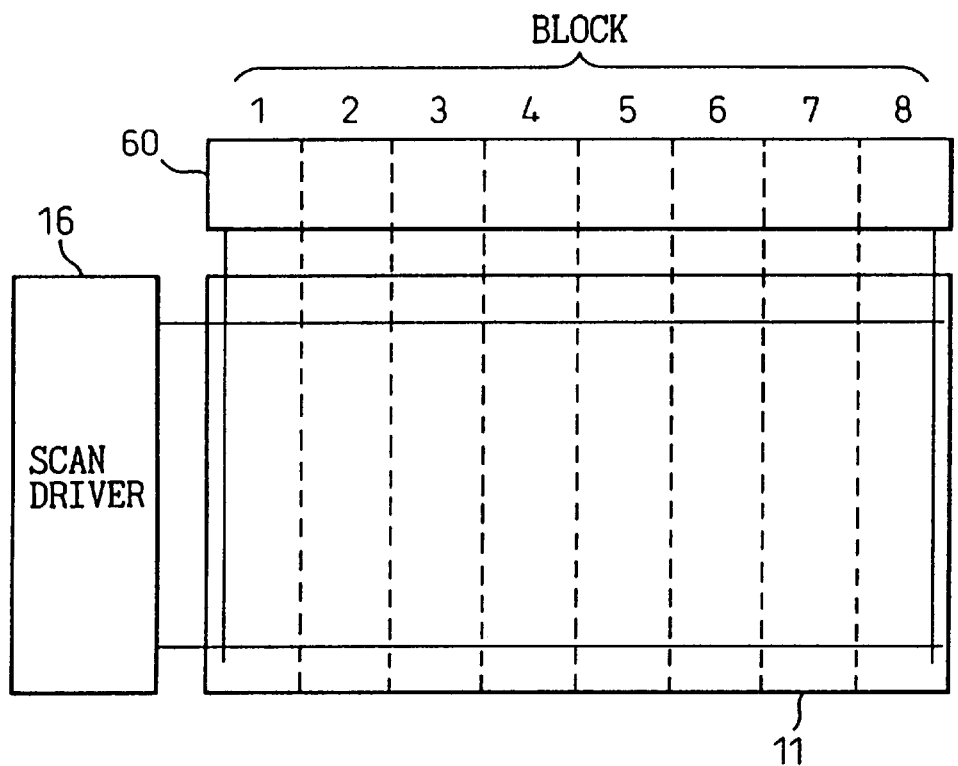
FIGS. 16A and 16B are diagrams showing the configuration of a liquid-crystal display in accordance with the fifth embodiment.
Figure 16B:
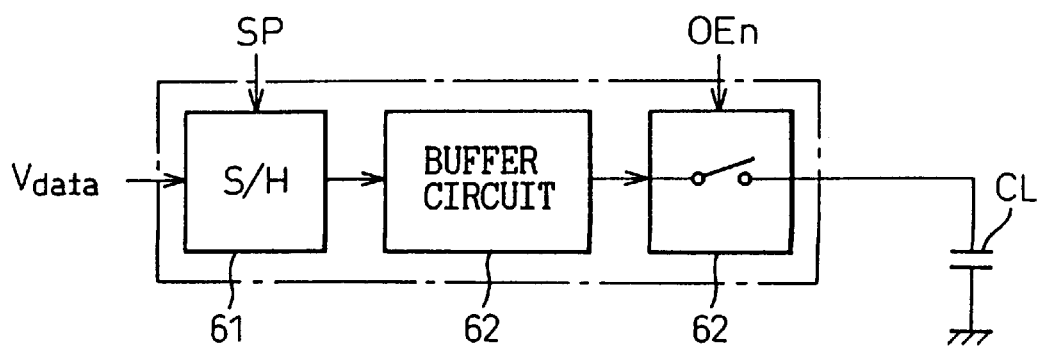

FIGS. 16A and 16B are diagrams showing the configuration of a liquid-crystal display in accordance with the fifth embodiment. FIG. 16A shows the overall configuration of the liquid-crystal display, and FIG. 16B shows the configuration of an output unit of a data driver which is connected on each data bus.

As shown in FIG. 16A, a data driver 60 is segmented into a plurality of display blocks (herein, 8 blocks), data buses in a liquid-crystal panel are linked to associated display blocks of the data driver. An output unit of the data driver 60 which is connected on each data bus includes, as shown in FIG. 16B, a sample-and-hold circuit 61 for sampling and holding display data Vdata synchronously with a sampling pulse SP, a buffer 62 for receiving an output of the sample-and-hole circuit 61 and driving a load, and a switch 63 that operates on the basis of an output enable signal OEn for isolating an output from a capacitive load CL. Writing of sampled output data Vdata in the load CL can be controlled block by block. A scan driver 16 delays a scan pulse relative to the start of a display data hold period and then outputs the scan pulse.

Figure 17:
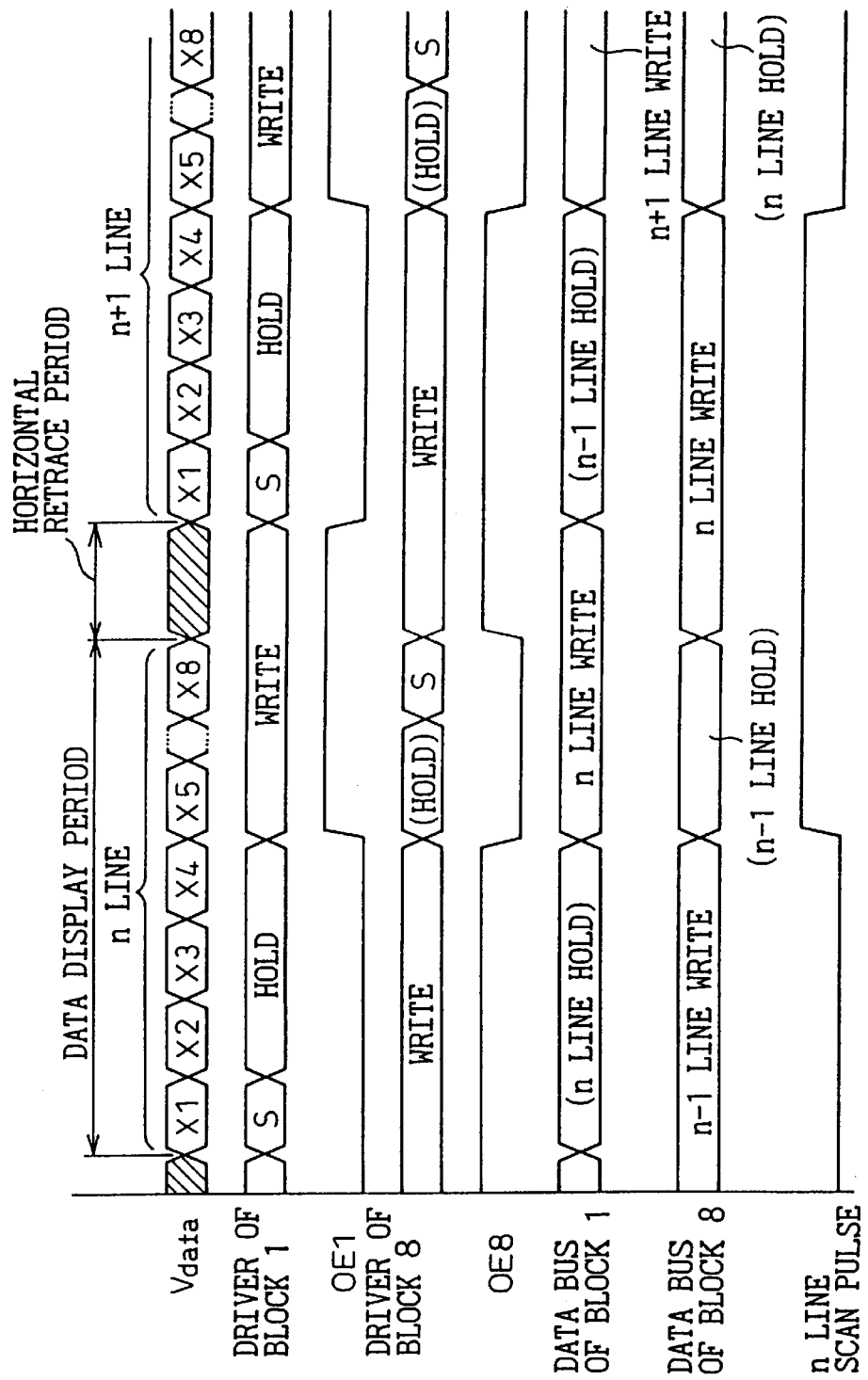
FIG. 17 is a diagram showing drive waveforms in accordance with the fifth embodiment.

FIG. 17 is a diagram showing drive waveforms to be applied in the liquid-crystal display in accordance with the fifth embodiment shown in FIGS. 16A and 16B. The sample-and-hold circuits 61 in the blocks latch display data Vdata that is sent sequentially. A scan pulse is output immediately after sampling is completed in the fourth block, and kept output until sampling of data concerning the next display line is completed in the fourth block. When sampling of data concerning the next display line is completed in the fourth block, a scan pulse is output onto the next scan bus. The first to third blocks that must wait for some time until a scan pulse is output after sampling is completed hold the data Vdata in the sample-and-hold circuits 61. After a scan pulse is output, the output enable signal OEn rises, and writing of data in the capacitive loads CL is started. In the fourth block, as soon as sampling is completed, the scan pulse is output. The output enable signal OEn therefore rises immediately, and writing of data in the capacitive load CL is started immediately. In the fifth to eighth blocks, when sampling is completed, the scan pulse has already been output. The output enable signal OEn therefore rises immediately and writing of data in the capacitive loads CL is started immediately.

Figure 18:
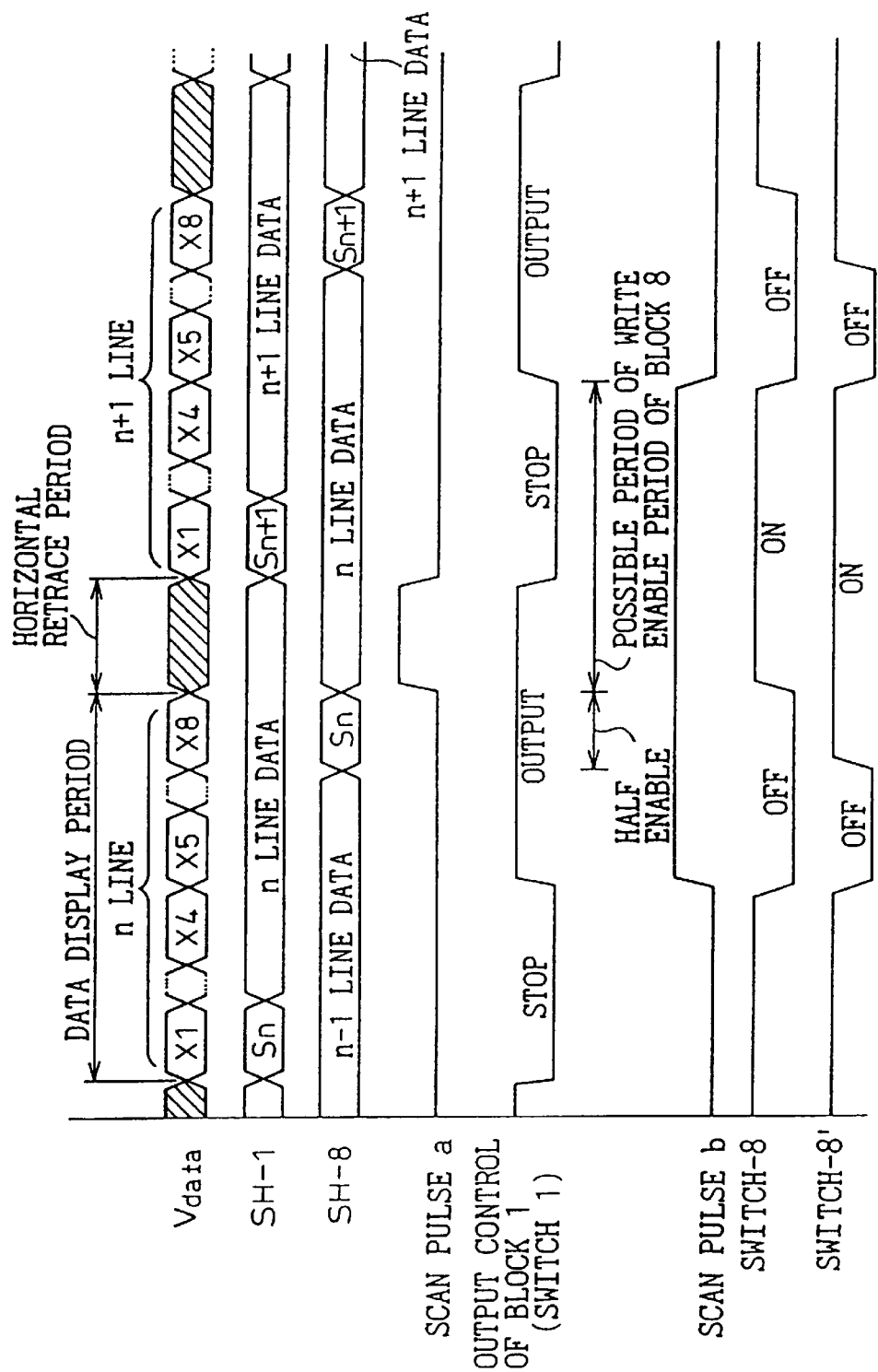
FIG. 18 is a diagram for explaining a longest writing time in accordance with the fifth embodiment.

FIG. 18 is a diagram for explaining the longest writing time in accordance with the fifth embodiment. As mentioned previously, a writing time should preferably be as long as possible. While display data X1 input to the first block is being output, the sample-and-hold circuit in the first block latches the data. The sample-and-hold circuit can hold the latched data until the block inputs display data concerning the next display line. The same applies to the eighth block. It is therefore a horizontal retrace period during which sampling of display data is completed in all the blocks and all display data items to be written are ready. When a scan pulse a is output during the horizontal retrace period, all the blocks can write the display data items simultaneously. The third embodiment shown in FIGS. 13 and 14 is an example in which the scan pulse a is output during the horizontal retrace period. However, in this case, the writing period is not long enough and is therefore required to be longer.

It is required that a scan pulse should not coincide with a scan pulse to be applied onto the next scan bus. The pulse duration of the scan pulse can be set to one frame at maximum. The first block waits for the shortest time until latching of display data concerning the next display line is started after a scan pulse rises. The time restricts a writing time usable by the first block. Moreover, since sampling data by the eighth block is completed last, the time required until outputting a scan pulse is completed after sampling is completed is shortest. The time restricts a writing time usable by the eighth block. When the writing times usable by the first and eighth blocks are equalized, the writing time is longest. Therefore, as shown in FIG. 18, a scan pulse is raised immediately after sampling data by the fourth block is completed, and lowered immediately after sampling data concerning the next display line by the fourth block is completed. Thus, the first block can write data until sampling display data concerning the next display line is started by the first block after a scan pulse rises. A writing period usable by the first block is therefore a sum of a half of a display data hold period and a horizontal retrace period. Likewise, a writing period usable by the eighth block is a period until a scan pulse rises immediately after sampling is completed, that is, a sum of a half of the display data hold period and the horizontal retrace period. Longer writing periods can be used by the other blocks. For example, the fourth block can carry out writing during a period during which a scan pulse is being output. However, since writing times usable by the blocks should preferably be the same, a period during which the output enable signal OEn is output is equalized among the blocks so that the writing times usable by the other blocks will be the same as the writing time usable by the first and eighth blocks. That is to say, the writing time is a sum of a half of the display data hold period and the horizontal retrace period. For example, when the VGA mode is adopted, since the display data hold period is 26 microseconds and the horizontal retrace period is 6 microseconds, the writing time is approximately 19 microseconds. The writing time is approximately three times longer than the writing time in accordance with the third embodiment which is equal to the horizontal retrace period. Compared with a writing time ensured by the point-sequential driving technique, the writing time is several hundred times longer.

Each block may start writing while sampling data. For example, a "half enable" period in FIG. 18 is a period during which the eighth block is sampling data. During the period, sampling is carried out sequentially and display data items are made ready successively. When writing data is started by the eighth block during the period, a longer writing time can be ensured for display data sampled earlier by the eighth block. In this case, when sampling display data has not been completed, display data concerning the preceding display line is written. However, since the correct display data is sampled and written during a short period of time during which writing is not completed, no problem occurs.

Figure 19:
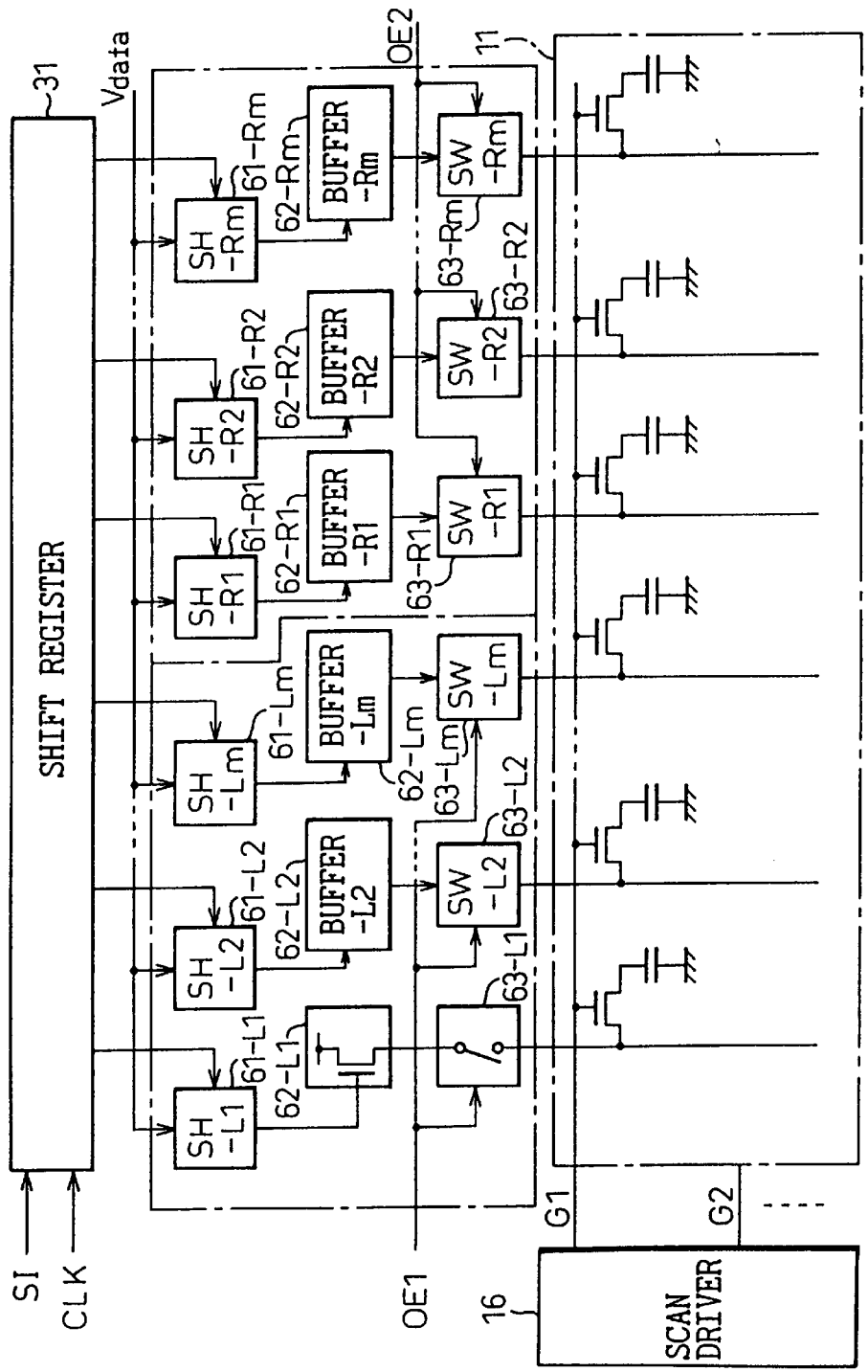
FIG. 19 is a diagram showing the configuration of a liquid-crystal display in accordance with the sixth embodiment.

FIG. 19 is a diagram showing the configuration of a liquid-crystal display in accordance with the sixth embodiment of the present invention. The sixth embodiment is an example. In which a data driver is segmented into two blocks. The data driver has a shift register 31 that operates with inputs of a sampling pulse SI and shift clock CLK. The data driver further includes sample-and-hold circuits (SH-L1, etc., and SH-Lm, and SH-R1, etc., and SH-Rm) 61-L1, etc., and 61-Lm, and 61-R1, etc., and 61-Rm which are respectively connected on data buses, and each samples and holds display data Vdata synchronously with a sampling pulse output from the shift register 31, buffers 62-L1, etc., and 62-Lm, and 62-R1, etc., and 62-Rm each driving a data bus according to an output of an associated sample-and-hold circuit, and analog switches 63-L1, etc., and 63-Lm, and 63-R1, etc., and 63-Rm interposed between the buffers and data buses. Among all the analog switches, the left-hand analog switches 63-L1, etc. are controlled by an output control signal OE1, while the right-hand analog switches 63-Lm, 63-R1, etc., and 63-Rm are controlled by an output control signal OE2. As illustrated, each buffer uses a source-follower amplifier.

Figure 20:
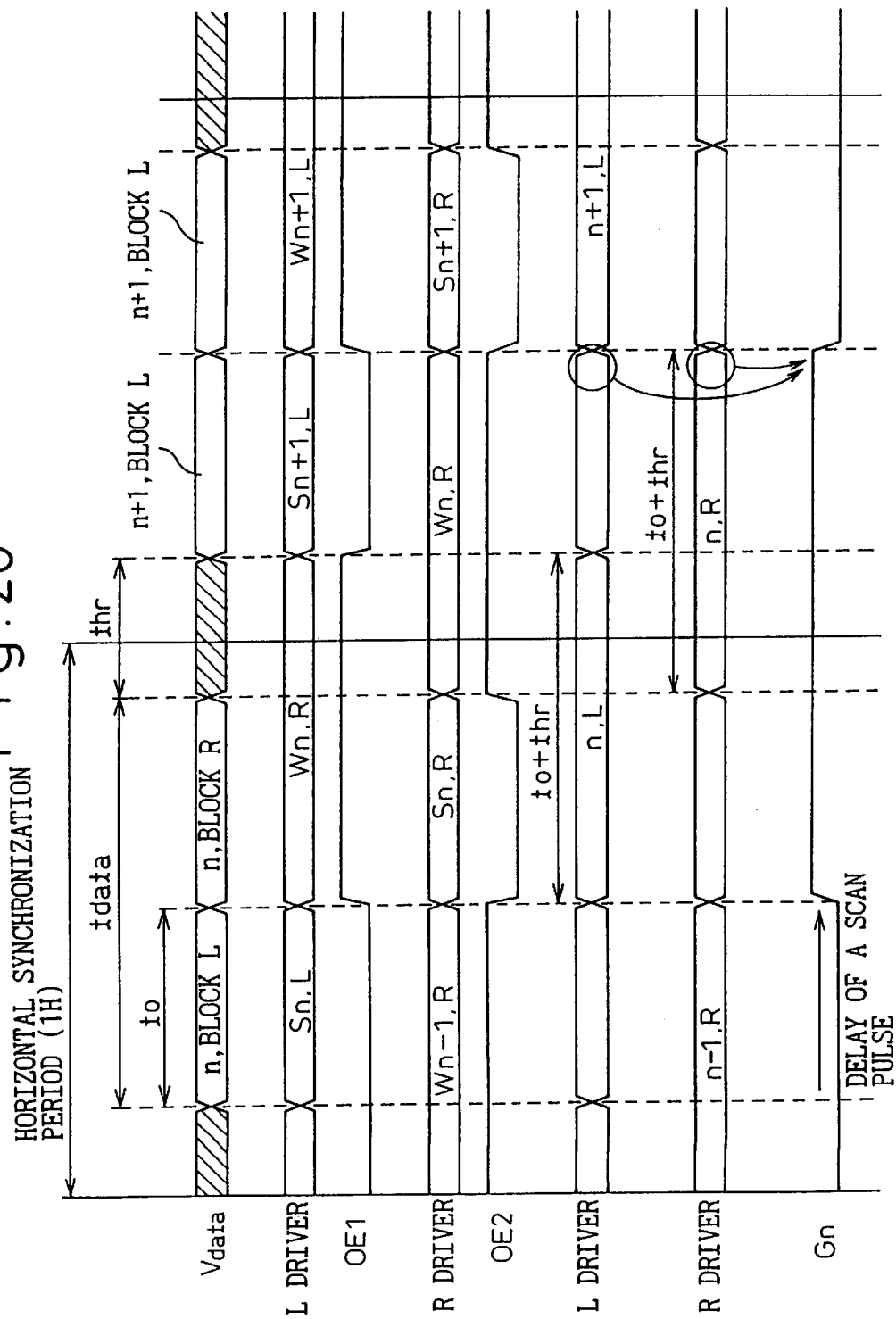
FIG. 20 is a diagram showing drive waveforms in accordance with the sixth embodiment.

FIG. 20 is a diagram showing drive waveforms in accordance with the sixth embodiment. In the sixth embodiment, since the data driver is segmented into two blocks, a scan pulse Gn rises immediately after the sampling of data by the right-hand block is completed, and falls before the right-hand block starts sampling data concerning the next display line. The output control signal OE1 rises simultaneously with the rise of the scan pulse Gn and falls simultaneously with the end of a horizontal retrace period. The output control signal OE2 rises simultaneously with the start of the horizontal retrace period and falls simultaneously with the fall of the scan pulse. A writing time usable by the left-hand and right-hand blocks is equal to a sum of a half of a display data hold period and the horizontal retrace period.

Figure 21:
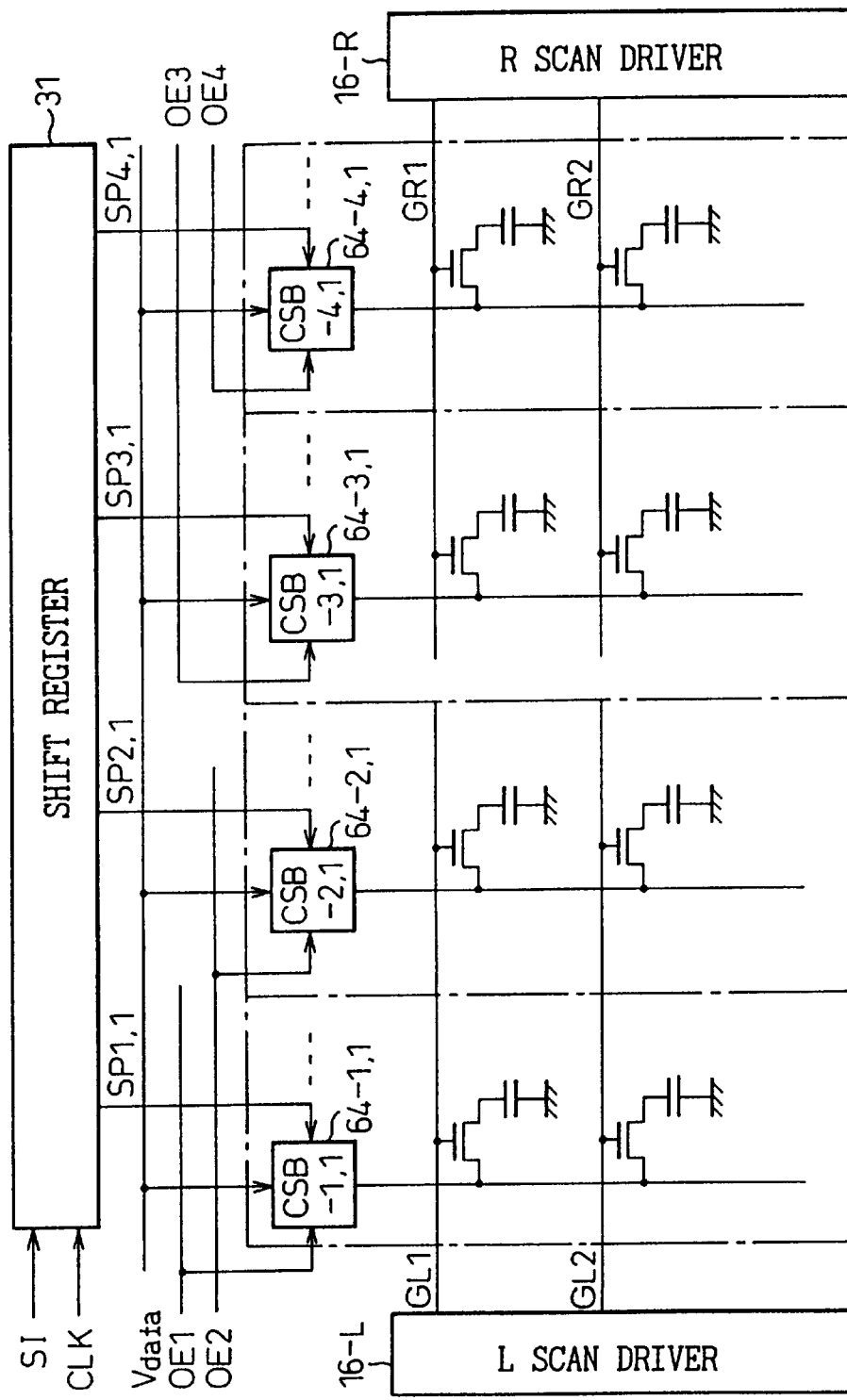
FIG. 21 is a diagram showing the configuration of a liquid-crystal display in accordance with the seventh embodiment.

FIG. 21 is a diagram showing the configuration of a liquid-crystal display in accordance with the seventh embodiment of the present invention. In the seventh embodiment, a data driver is segmented into four blocks, and a scan driver is divided into left-hand and right-hand scan drivers. The compensation sampling buffers (CSBs) employed in the first embodiment are substituted for the sample-and-hold circuits, buffers, and switches. The compensation sampling buffers 64-1,1, etc. are connected on data buses and grouped into the four blocks. Signals OE1, OE2, OE3, and OE4 are input as output control signals to the CSBs in each block. In the drawing, only the leftmost CSB in each block is shown. The leftmost CSB (CSB-1,1) in the first block is a CSB 64-1,1, the leftmost CSB (CSB-2,1) in the second block is a CSB 64-2,1, the leftmost CSB (CSB-3,1) in the third block is a CSB 64-3,1, and the leftmost CSB (CSB-4,1) in the fourth block is a CSB 64-4,1. Scan drivers 16-L and 16-R are installed on the left-hand side and right-hand side of a cell array respectively. To TFTs in the first and second blocks, a scan pulse is supplied from the left-hand scan driver 16-L. To TFTs in the third and fourth blocks, a scan pulse is supplied from the right-hand scan driver 16-R.

Figure 22:
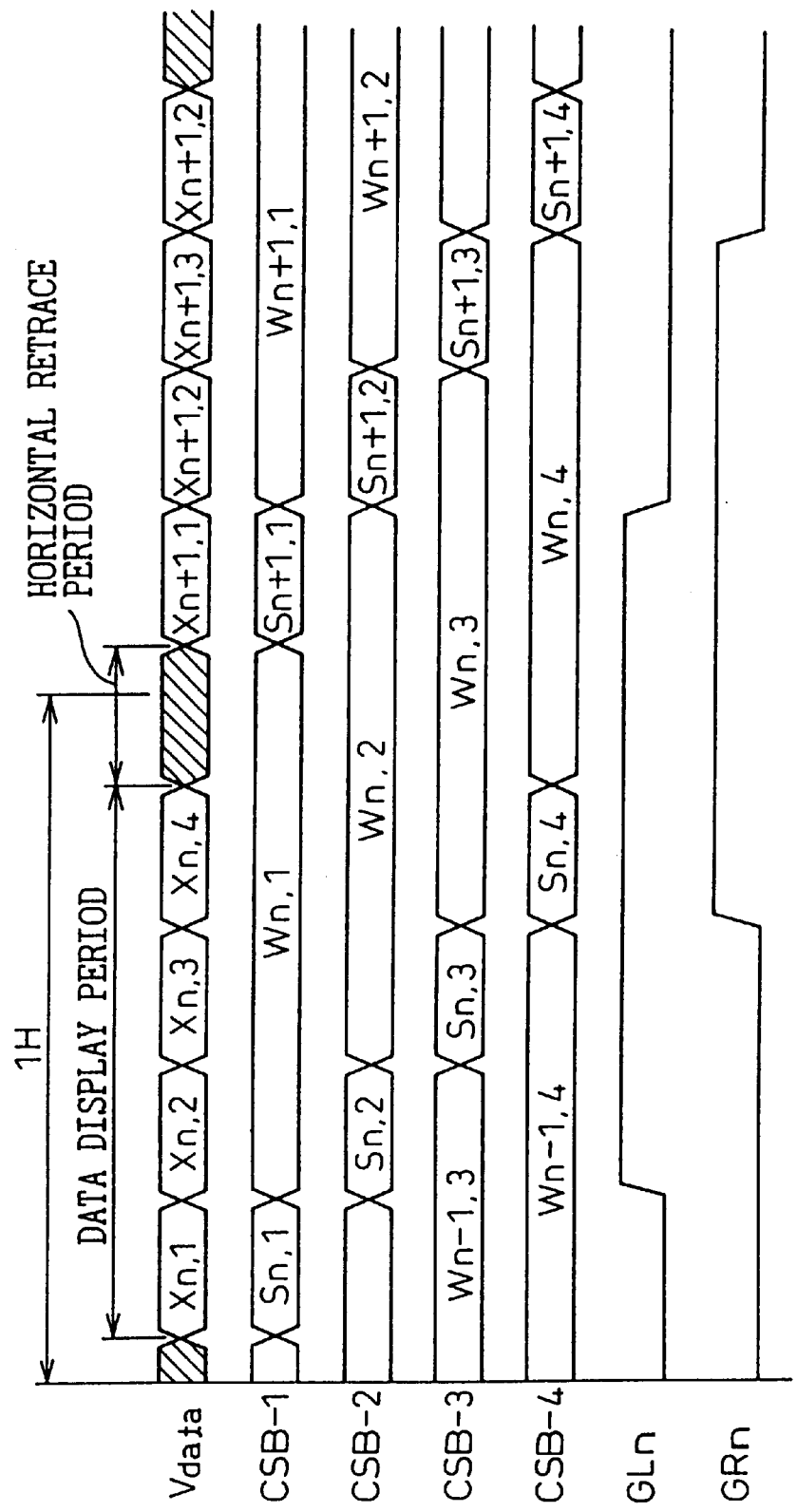
FIG. 22 is a diagram showing drive waveforms in accordance with the seventh embodiment.

FIG. 22 is a diagram showing the operations of the CSBs in the blocks and scan pulses in accordance with the seventh embodiment. As illustrated, a scan pulse GLn output from the left-hand scan driver 16-L rises when the sampling of data by a CSB CSB-1 in the first block is completed, and falls before the CSB CSB-1 starts sampling data concerning the next display line. A scan pulse GRn output from the right-hand scan driver 16-R rises when the sampling of data by a CSB CSB-3 in the third block is completed, and falls before the CSB CSB-3 starts sampling data concerning the next display line. The CSB CSB-1 carries out writing until it restarts sampling after completing sampling. Likewise, the CSBs CSB-2, CSB-3, CSB-4 carry out writing until they restart sampling after completing sampling. Thus, the times during which the blocks carry out writing are mutually the same and equal to a sum of three-fourths of a display data hold period and a horizontal retrace period.

Figure 23:
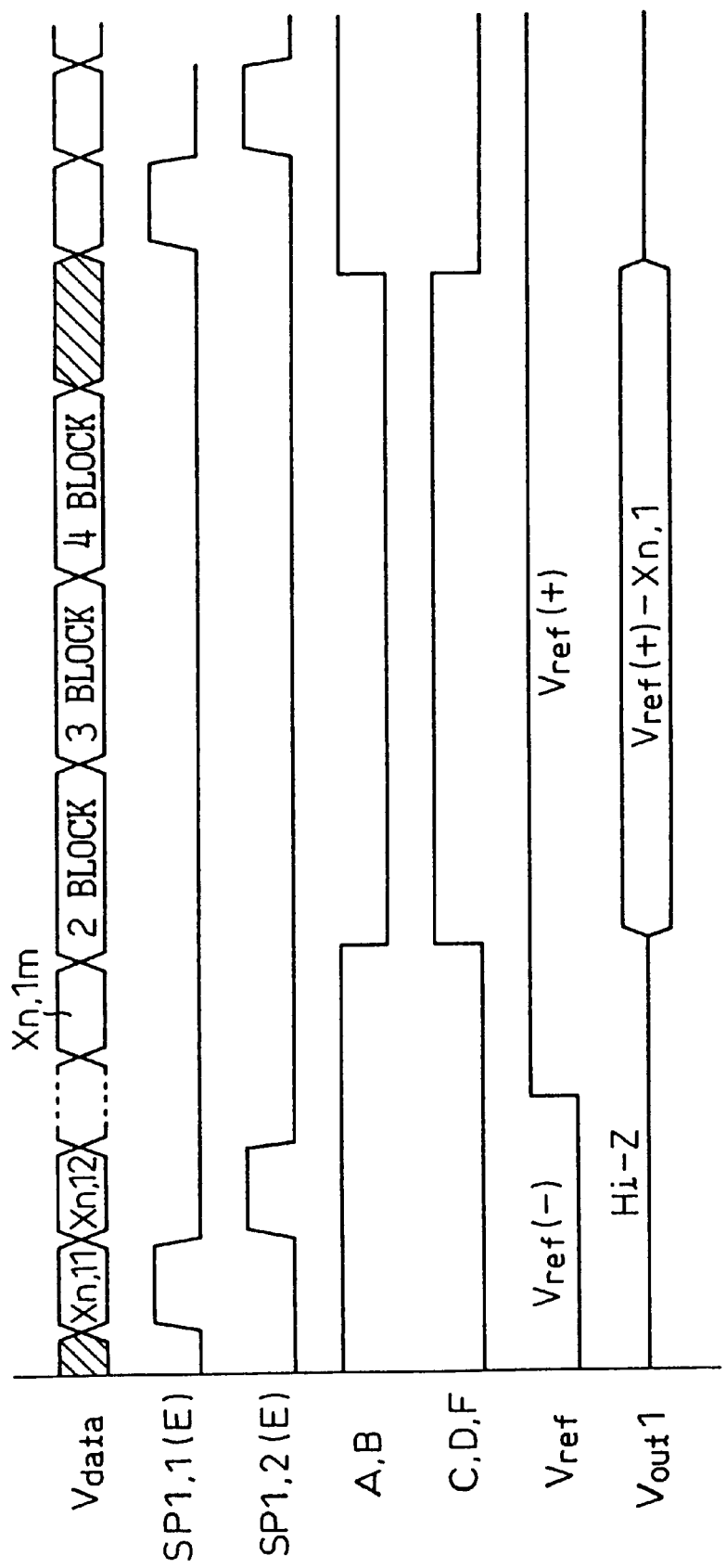
FIG. 23 is a diagram showing drive waveforms in accordance with the seventh embodiment in detail.

FIG. 23 is a diagram showing the operations to be performed inside the CSBs in the first block according to the seventh embodiment. Illustrated are the control signals A to F to be applied to the switches 38 to 43 in the CSB shown in FIGS. 7A and 7B, and the variation of an output. When display data vdata is input to the first block, the control signals A and B are high and the control signals C, D, and F are low. In this state, the sampling pulses SP1,1, SP1,2, etc. output from the shift register 31 are input as the control signal E to be applied to the switches 42, the display data Vdata is latched in the holding capacitors 36. After input of the display data Vdata to the first block is completed, until another display data Vdata is input next to the first block, the control signals A and B remain low and the control signals C, D, and F remain high, and the control signal E remains low. Each CSB outputs a difference between the reference voltage and display data, and writes it in an associated capacitive load CL.

As mentioned above, according to the seventh embodiment, the compensation sampling buffers are employed. Despite the relatively simple circuitry, therefore, high-precision driving hardly susceptible to an uncertainty in the characteristic of a device can be achieved. This results in improved display quality. Moreover, the data buses are grouped into four blocks, and the scan buses are grouped into right-hand and left-hand blocks. A scan pulse is supplied from separate scan drivers located right and left to the right-hand and left-hand blocks of scan buses. A writing time during which each block writes data can therefore be set to as long as a sum of three-fourths of a display data hold period and a horizontal retrace period. The writing time is approximately 80% of one horizontal scanning period. Thus, a writing time approximately, equal to the writing time usable by the data driver having two stages of sample-and-hole circuits shown in FIG. 1 can be ensured. The scan driver provides a binary output, has simple circuitry, and operates stably. Even when two scan drivers 16-L and 16-R are installed on the left-hand and right-hand sides of a screen as they are in the seventh embodiment, the circuitry of a liquid-crystal display will not become very complex. This leads to a longer writing time usable by the data driver. The installation of two scan drivers therefore has a great merit. Incidentally, the scan driver may be segmented into numerous blocks. In this case, a writing time can be extended by shifting the output timing of a scan pulse.

In the fifth to seventh embodiments, display data is analog data. The embodiments can also be adapted to digital display data. In this case, like the third embodiment described in conjunction with in FIG. 13, a D/A converter may be installed on the input stage for inputting display data. Otherwise, like the fourth embodiment described in conjunction with FIG. 15, digital latches, D/A converters, and switches may be installed to be connected on data buses.

As mentioned above, the fifth to seventh embodiments have been described by taking a poly-crystalline silicon LCD having drive circuits inclusively as an example. The configuration and driving method in accordance with the present invention can be adapted to a driver IC, for an amorphous silicon LCD, which is supplied in the form of an IC. For example, a data driver comprises sampling circuits each composed of an analog switch and a sampling capacitor, buffers each including an operational amplifier that is highly precise and has a high-grade driving ability, and isolation switches each formed with an analog switch. The aforesaid driving method is implemented in the data driver. This results in a more compact driver IC. Consequently, since the configuration of an IC becomes simpler and a chip becomes smaller, the cost of the driver IC can be reduced. This will contribute to a reduction in cost of the whole LCD.

Moreover, in the fifth to seventh embodiments, despite the relatively simple configuration, the writing time usable by the data driver is longer, by about one hundred times or more, than that ensured by conventional point-sequential driving. In particular, for an LCD having drive circuits inclusively such as a poly-crystalline silicon LCD, a larger screen and higher definition can be realized. The configurations in accordance with the fifth to seventh embodiments can be adapted to general driver ICs. Thus, the present invention contributes to a reduction in size or cost of a driver employed in an LCD.

Figure 24:
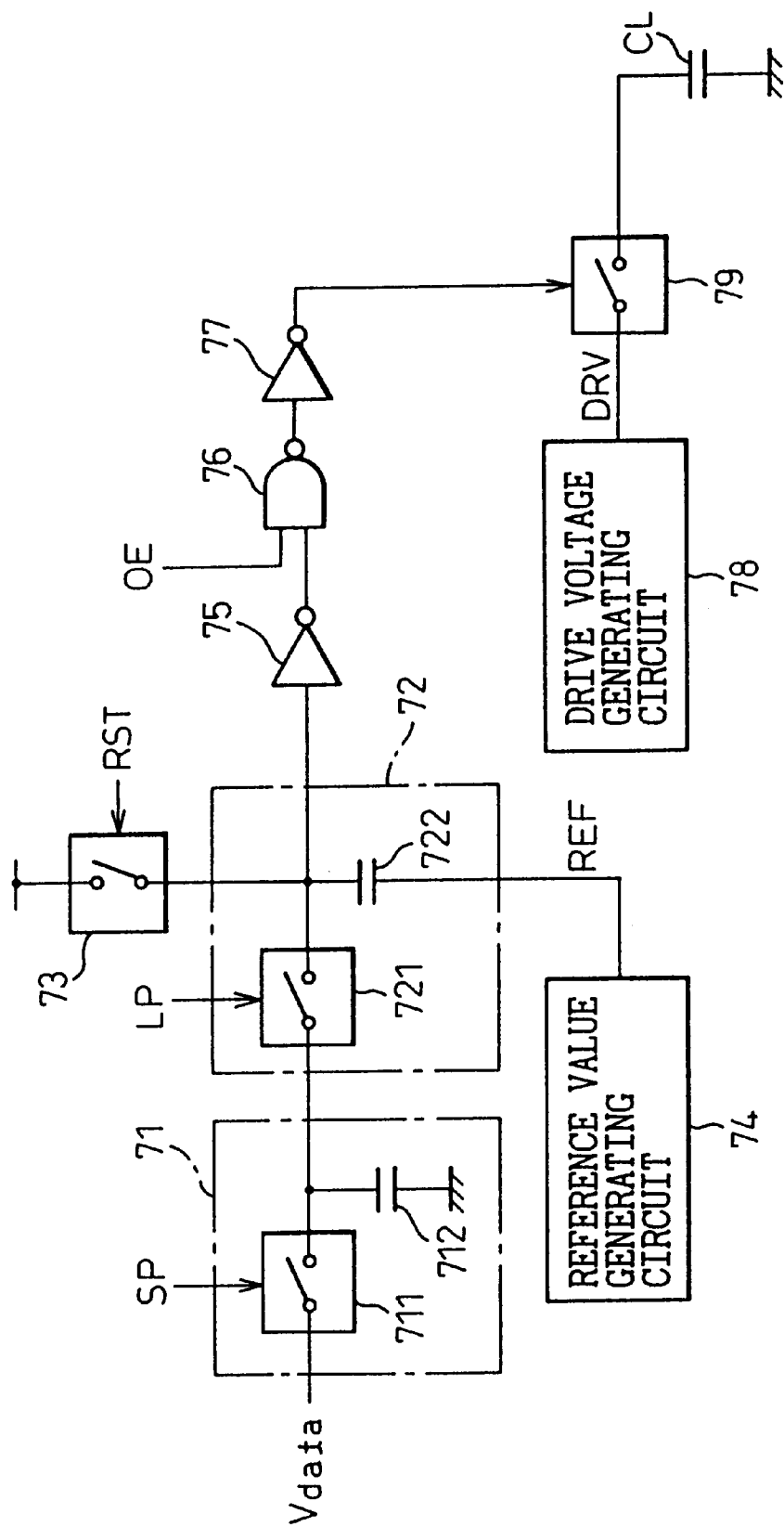
FIG. 24 is a diagram showing the configuration of a drive circuit for liquid-crystal displays in accordance with the eighth embodiment.
Figure 25:
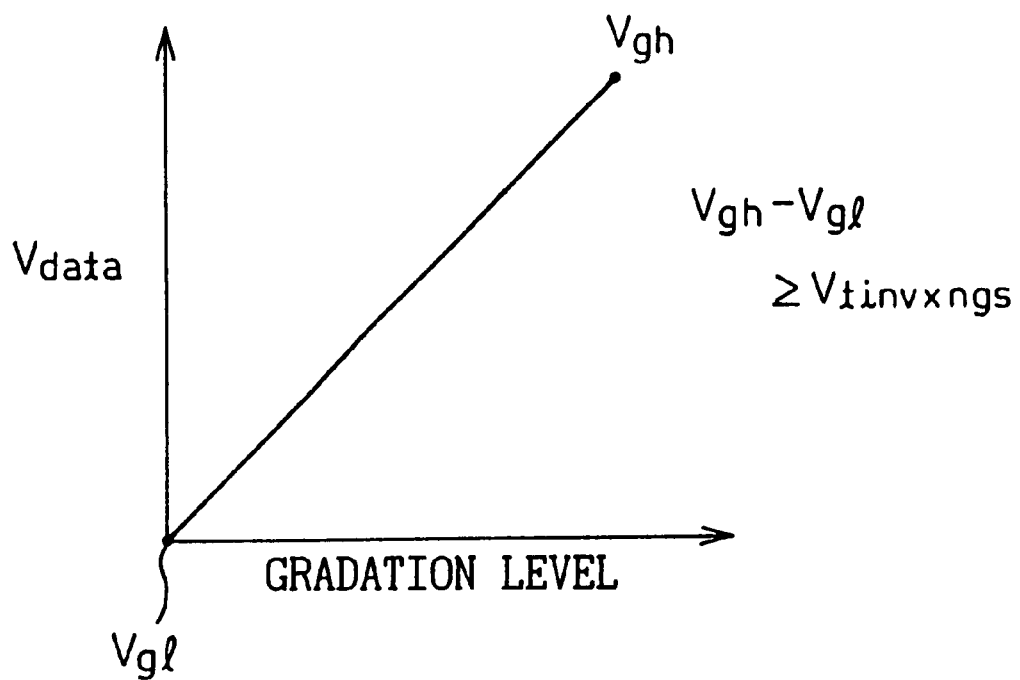
FIG. 25 is a diagram showing a display data signal in accordance with the eighth embodiment.

FIG. 24 is a diagram showing the configuration of a drive circuit in accordance with the eighth embodiment of the present invention. The drive circuit corresponds to one output unit of a data driver and is installed for each data bus. In the eighth embodiment, display data Vdata shall be analog data that varies, as shown in FIG. 25, from voltage Vg1 to voltage Vgh according to a gradation level. Display data Vdata is sampled by a first sample-and-hold circuit 71 composed of an analog switch 711 that operates synchronously with a sampling pulse SP and a holding capacitor 712. An output of the first sample-and-hold circuit 71 is latched in a second sample-and-hold circuit 72 composed of an analog switch 721 that operates synchronously with a control pulse LP and a holding capacitor 722. An analog reference value REF sent from a reference value generating circuit 74 is applied to a reference-potential terminal of the holding capacitor 722. A reset switch 73 is connected to the other terminal of the holding capacitor 722. An output of the second sample-and-hold circuit 72 is input to an inverter 75. An output of the inverter 75 is input to a NAND 76 and its output is input to an inverter 77 having a large driving ability, whereby an analog switch 79 is controlled. The analog switch 79 is controlled so as to determine whether or not an output of a drive voltage generating circuit should be provided. The NAND 76 realizes an output enable function. When an output enable signal OE is low, the NAND stops providing an output. When the output enable signal OE is high, the output is provided. The inverter 77 works to reinforce the driving ability of the drive circuit. The NAND 76 and inverter 77 cooperate with each other in reshaping the waveform of an output signal.

Figure 26B:
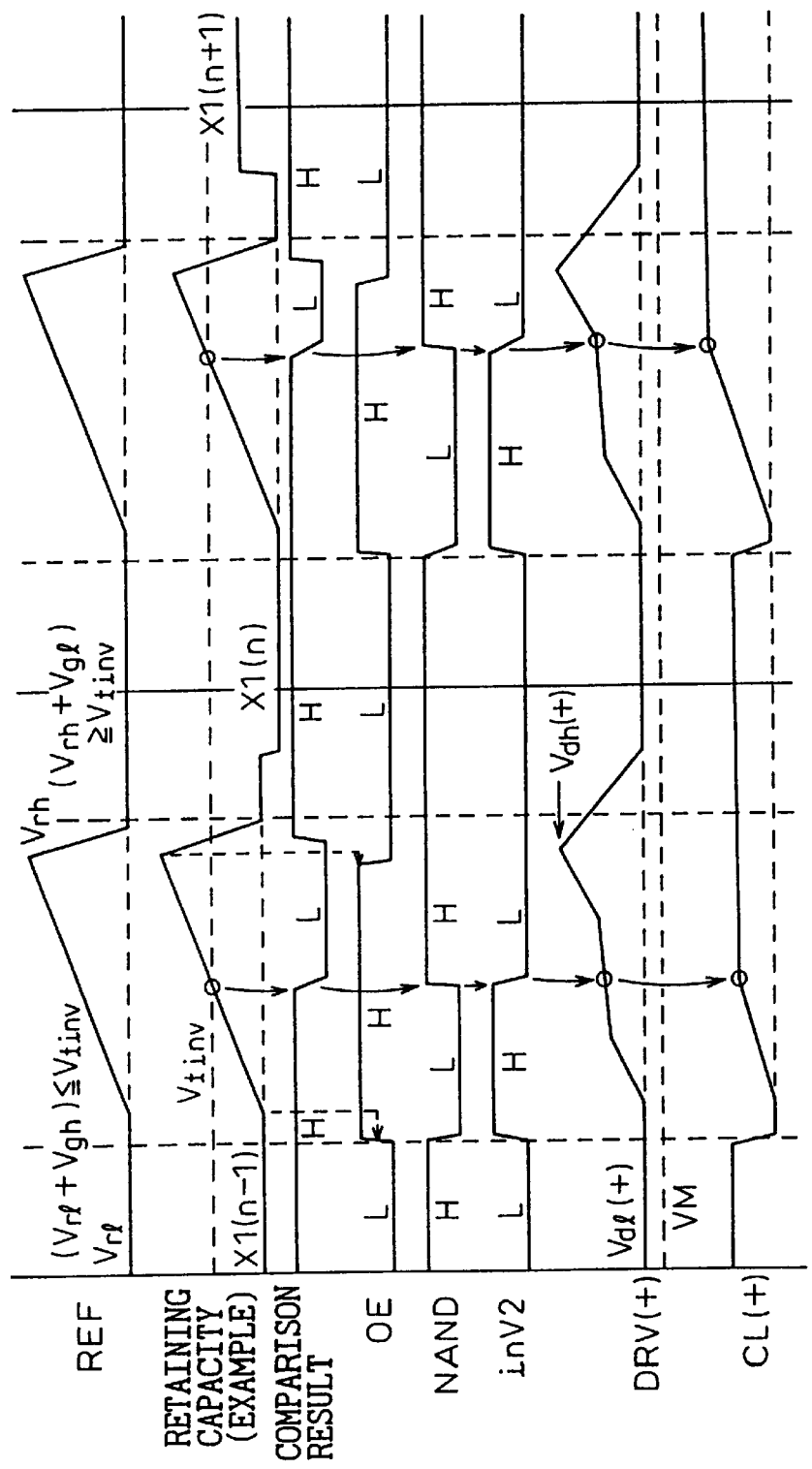

FIGS. 26A and 26B are diagrams showing drive waves in accordance with the eighth embodiment, wherein an input data stream starting with a display data item x1 is partly shown. Display data Vdata to be input during a display data hold period is sampled by the first sample-and-hold circuits 71 synchronously with the sampling pulses SP1 to SPm. During the first half of a horizontal retrace period, the switches 73 are turned on in response to a signal RST. After the holding capacitors 722 are reset, a signal LP is driven high and the switches 721 are turned on. The holding capacitors are then charged.

An output REF of the reference value generating circuit 74 is a signal that varies from voltage Vr1 to voltage Vrh during a display data hold period. The signal REF is illustrated as varying in the form of a rectangular wave but need not be a wave that varies linearly or a continuous wave. The signal REF should merely have a voltage varying with the passage of time and exhibit the same waveform as a wave DRV that will be described later. The values Vr1 and Vrh must satisfy the conditions of $(Vr1+Vrh) \leq Vtinv$ and $Vting \leq (Vrh+Vg1)$ where Vtinv denotes the threshold voltage of the inverter 75. The retained potential at the holding capacitor 722 is latched in response to the control pulse LP. Thereafter, since a reference potential fluctuates while exhibiting the same waveform as the signal REF, the retained potential fluctuates as illustrated. The retained potential finally exceeds a voltage Vtin, and the output of the inverter varies. The variation timing may be advanced or delayed according to a voltage latched in advance in the holding capacitor 722, that is, display data. The timing of changing the switch 79 from an on state to an off state is advanced or delayed accordingly. Consequently, the inverter 75 can be said to operate as a comparing circuit for comparing the signal REF with display data. An output DRV of the drive voltage generating circuit 79 exhibits the same waveform as the signal REF. When the switch 79 is changed from the on state to the off state according to the above timing, the corresponding voltage DRV is latched in a capacitive load CL.

Figure 27A:
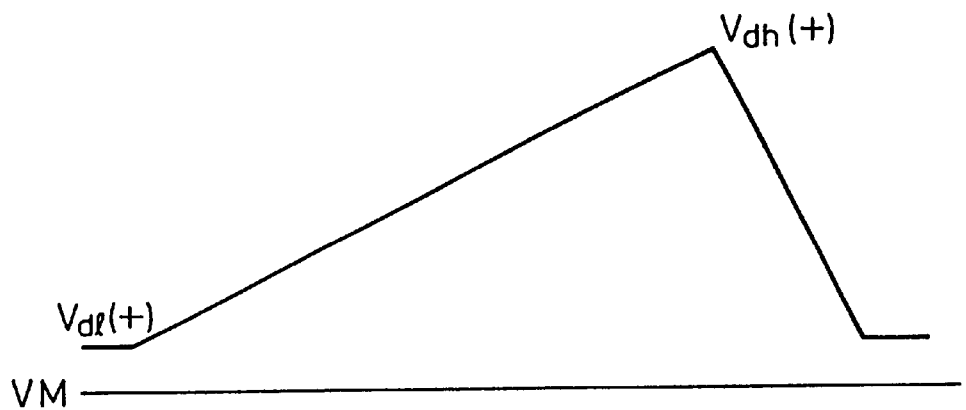
FIGS. 27A and 27B are diagrams showing drive waveforms to be applied during different frames according to the eighth embodiment.
Figure 27B:
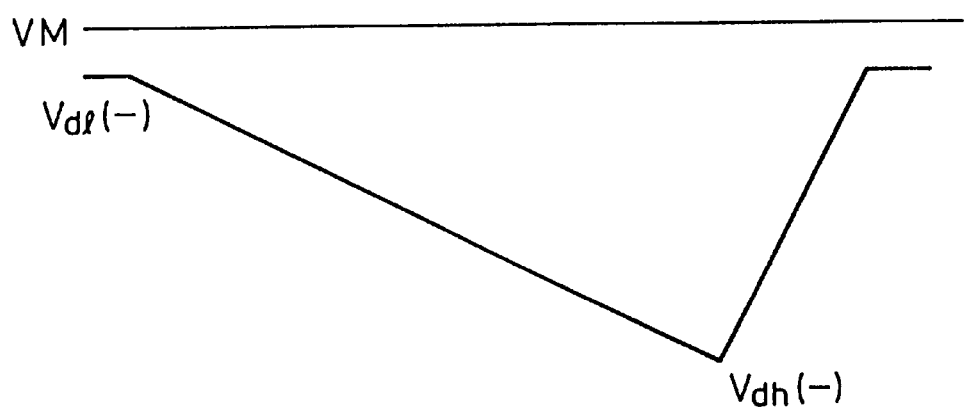

Herein, when the voltage DRV is positive, it is, as shown in FIG. 27A, a wave varying from voltage Vd1(+) to voltage Vdh(+). When the voltage DRV is negative, it is, as shown in FIG. 27B, a wave varying from voltage Vd1(−) to voltage Vdh(−). The voltage DRV as well as the potential REF may exhibit any waveform other than the illustrated one. Moreover, a NOR circuit may be substituted for the inverter 75 and NAND 76. An output enable signal OE of opposite polarity may be employed.

In the eighth embodiment, display data Vdata held in the sampling circuit 71 and the reference potential REF are compared by the inverter 75 that acts as a comparing circuit having simple circuitry. Consequently, a pulse whose timing is different is output as a result of comparison according to display data. Depending on the result of comparison, the timing of turning off the switch 79 varies. A drive voltage DRV output from the drive voltage generating circuit 78 varies like the potential REF. As a result, a voltage proportional to display data is latched in the capacitive load CL. Herein, it is the drive voltage generating circuit 78 and switch 79 that actually drive the large capacitive load CL. The first and second sample-and-hold circuits 71 and 72 and the other components need not be provided with a great driving ability. This makes it possible to reduce the size of a transistor and to design a whole circuit compactly.

Moreover, according to a prior art, for creating a comparing circuit, there is no method other than a method of employing an operational amplifier. The circuit is therefore large in size. When a comparing circuit can be realized with an inverter as it is in the eighth embodiment, line-sequential driving can be achieved with a compact configuration. Eventually, a drive circuit capable of ensuring a long writing time during which a voltage representing data is applied on a bus and which is effective for realizing a larger screen and higher definition can be realized.

In the eighth embodiment, the first and second sample-and-hold circuits 71 and 72 do not have the capability of a buffer. If an analog buffer such as a buffer including a source-follower amplifier employed in the first embodiment is included in at least the first sample-and-hold circuit 71, the reset switch 73 in the second sample-and-hold circuit 72 can be omitted. In the eighth embodiment, the drive voltage DRV is a waveform varying so as to deviate from a reversal center voltage VM. The drive voltage DRV may be a gamma-corrected wave. For example, the magnitude of variation of the voltage DRV is set to be small in relation to intermediate gradation levels and to be large in relation to the other gradation levels. Thus, high-quality display offering both excellent contrast and gradation can be provided relatively readily.

Figure 28:
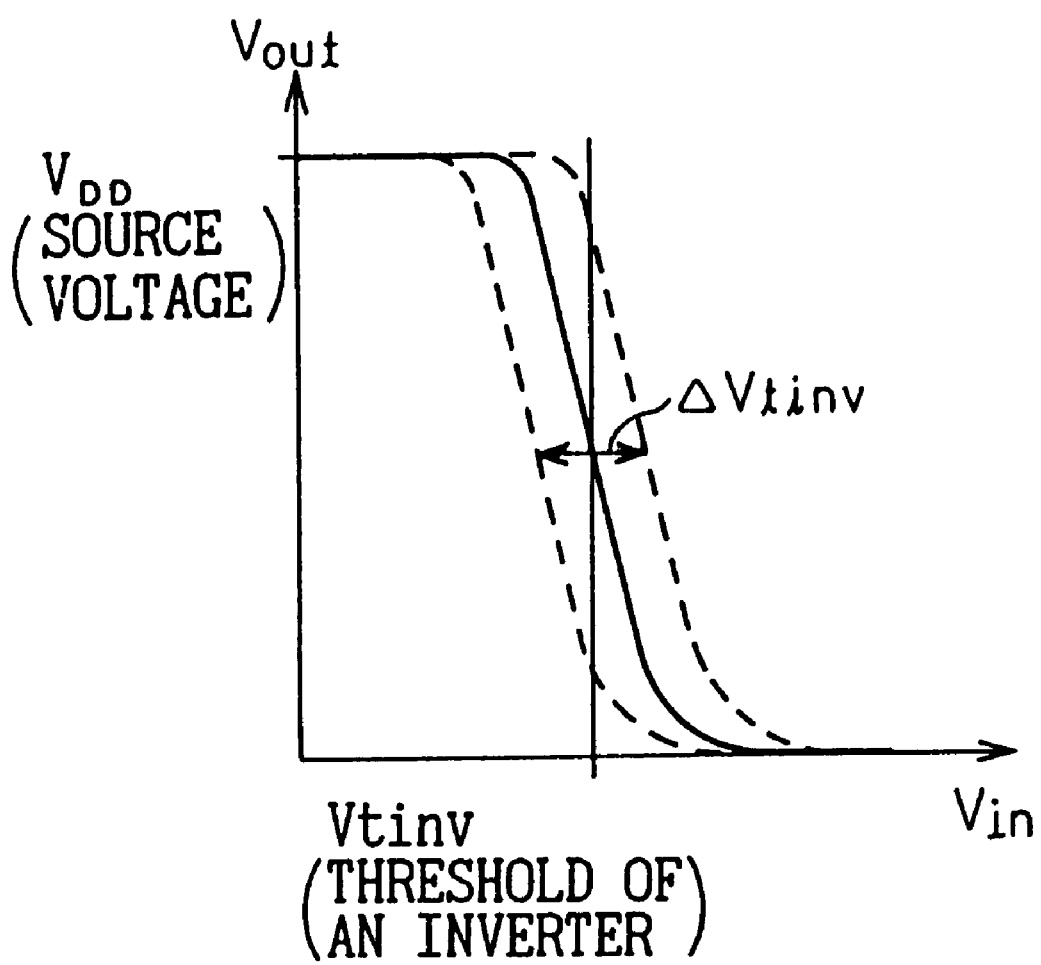
FIG. 28 is a diagram for explaining the variation of the threshold voltage of an inverter.

FIG. 28 is a diagram for explaining the variation of the threshold voltage of an inverter. When CMOS is employed, the threshold voltage, Vtin, of a logic circuit such as an inverter is generally equal to about a half of a supply voltage and changes in a range of values Vtinv due to the variation in the characteristic of a device. In the eighth embodiment, since the output of the inverter varies depending on the threshold voltage thereof, the inverter is functioned as a comparing circuit. If the threshold voltage is varied, the timing of turning off the switch 9 changes. In the ninth embodiment, an effort is made to eliminate an adverse effect derived from the variation in the threshold voltage of an inverter.

Figure 29:
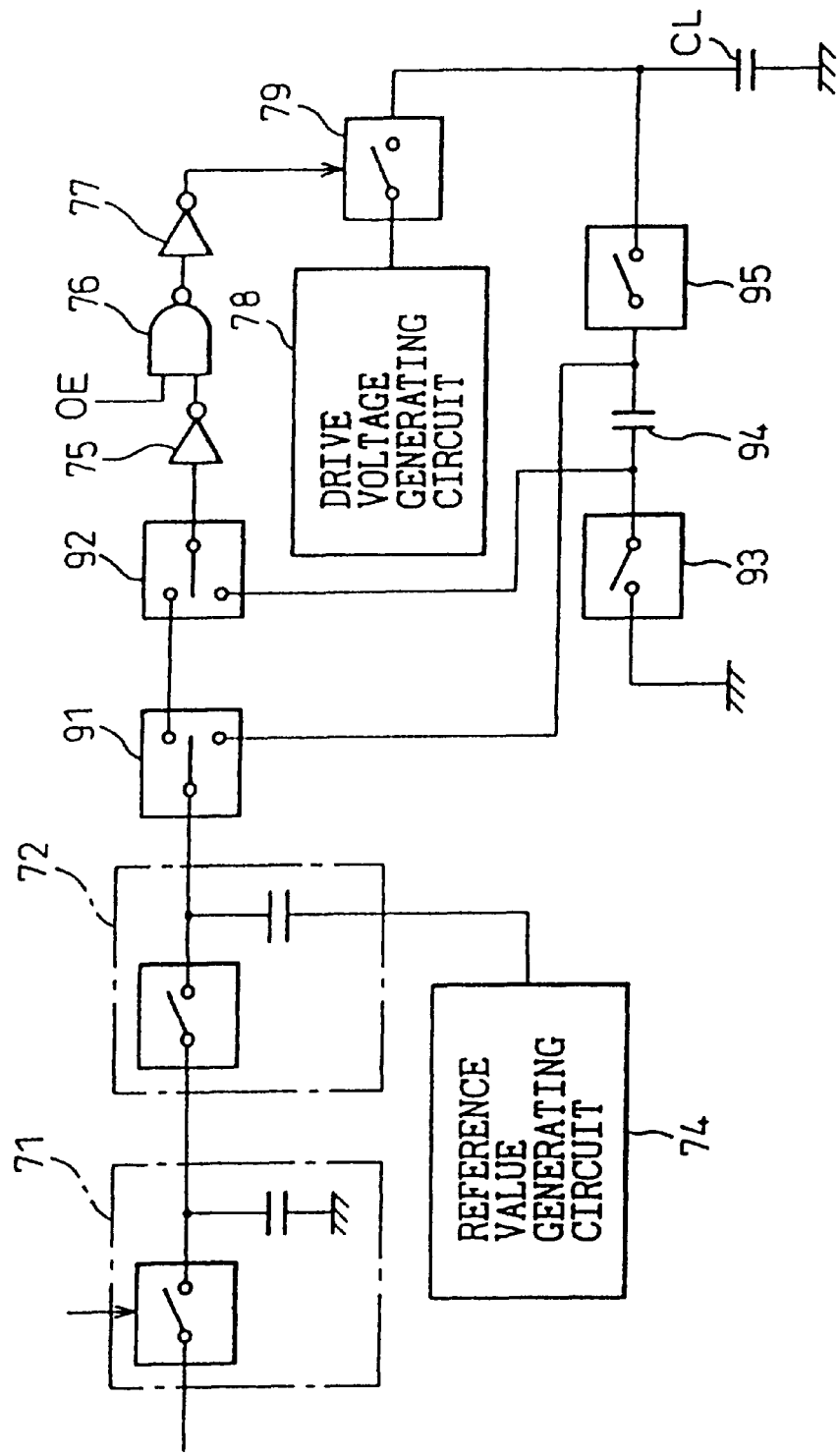
FIG. 29 is a diagram showing the configuration of a drive circuit for liquid-crystal displays in accordance with the ninth embodiment.

FIG. 29 is a diagram showing the configuration of a drive circuit in accordance with the ninth embodiment. The drive circuit in accordance with the ninth embodiment is realized by adding switches 91 to 93 and 95 and a compensating capacitor 95 to the drive circuit in accordance with the eighth embodiment shown in FIG. 24. The variation in the threshold voltage of the inverter 75 is corrected by turning the switches on or off.

Figure 30:
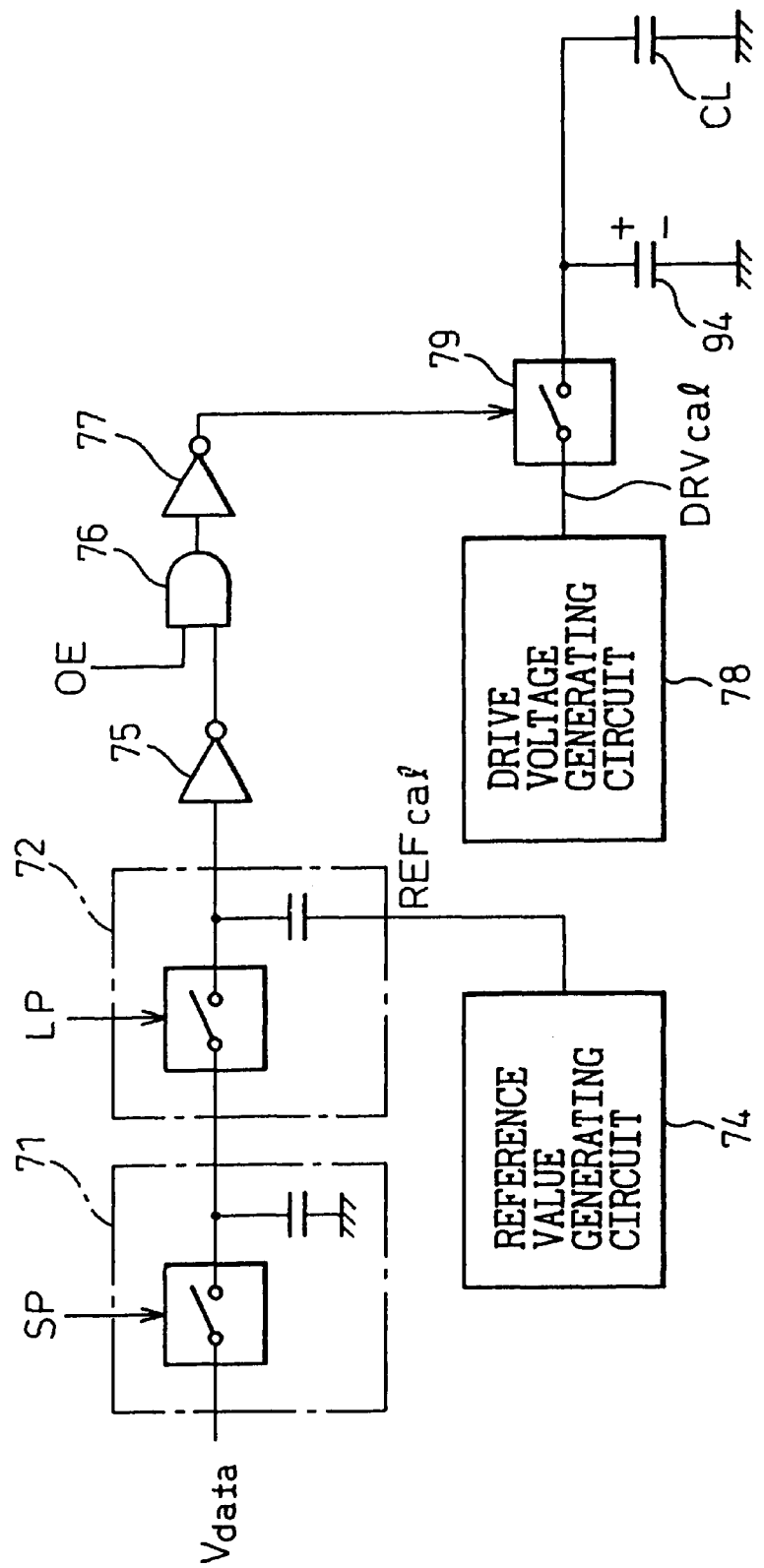
FIG. 30 is a diagram showing a first connected state in accordance with the ninth embodiment.
Figure 31:
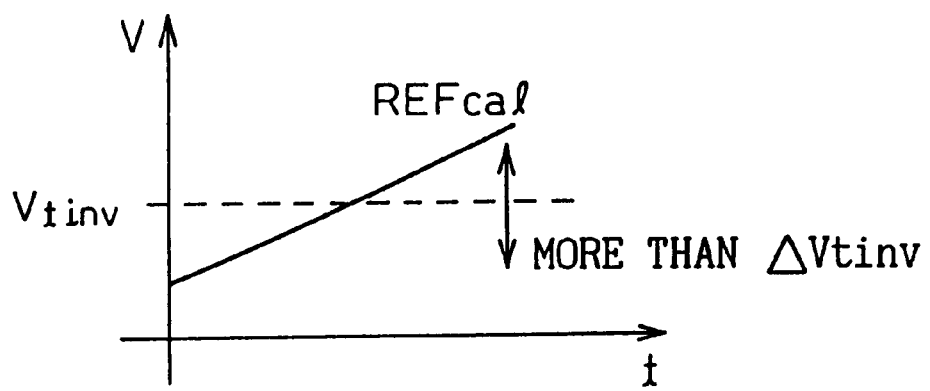
FIG. 31 is a diagram showing a reference value signal in the first connected state in accordance with the ninth embodiment.
Figure 32:
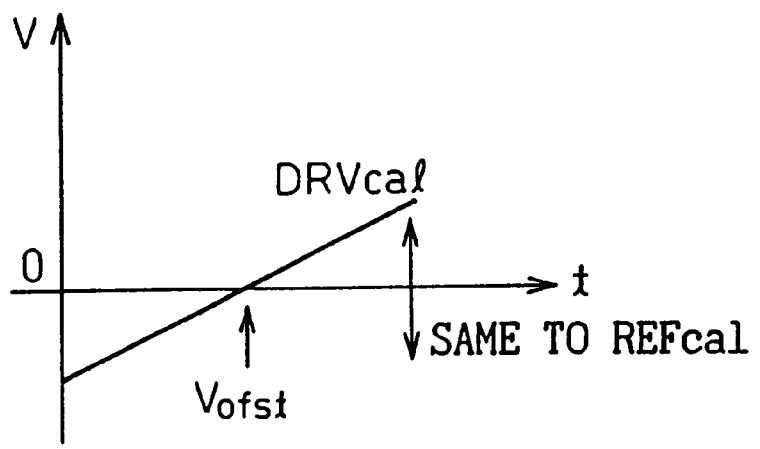
FIG. 32 is a diagram showing a drive signal in the first connected state in accordance with the ninth embodiment.

FIG. 30 is a diagram showing a first state of the drive circuit in accordance with the ninth embodiment. In this state, the switches 91 and 92 are operated so that an output of the second sample-and-hold circuit 72 will be input to the inverter 75. The switches 93 and 95 are operated so that the compensating capacitor 94 will be connected between a driving line leading to a capacitive load CL and a line on which a reference potential exists. In this state, the reference value generating circuit 74 outputs, as shown in FIG. 31, a detection wave REFcal whose amplitude is equal to or larger than an amplitude Vtinv with a voltage Vtinv as a center. The drive voltage generating circuit 78 outputs, as shown in FIG. 32, a voltage DRVcal whose amplitude is identical to that of the wave REFcal and whose offset voltage Vofst has an arbitrary value (herein Vofst=0 V). The voltage DRVcal, of which timing relative to the voltage REFcal is such that the voltage DRVcal has a zero crossing when the voltage REFcal exceeds the original threshold value of the inverter, is retained. This means that a deviation of the threshold value of the inverter is detected.

Figure 33:
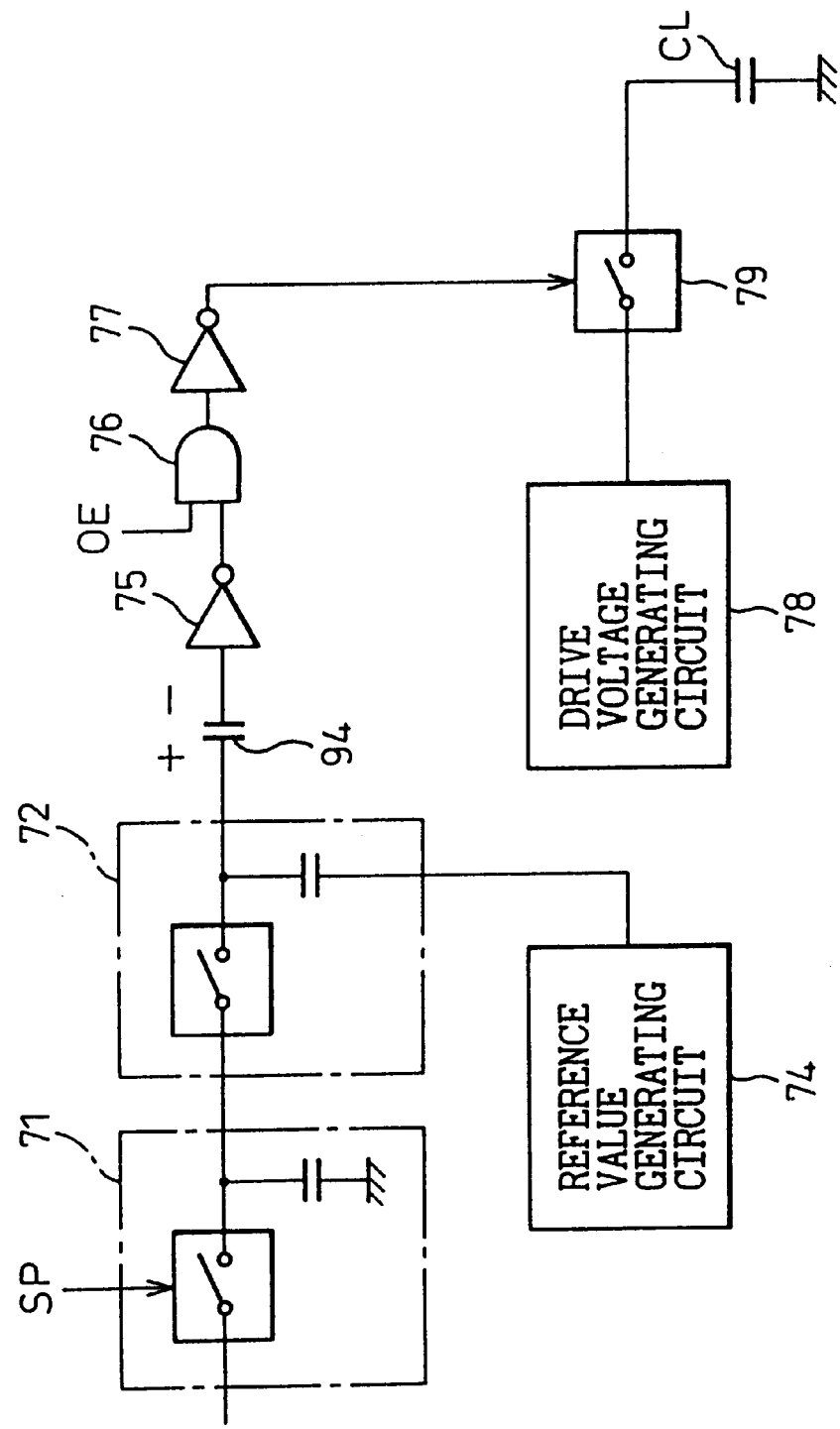
FIG. 33 is a diagram showing a second connected state in accordance with the ninth embodiment.

Next, in a second state, as shown in FIG. 33, the switches 91 to 93 and 95 are operated so that the compensating capacitor 94 will be connected between the second sample-and-hold circuit 72 and inverter 75. Herein, a negative terminal of the compensating capacitor 94 is connected to the inverter order to match. The reference value generating circuit 74 outputs a reference value signal REF in the same manner as that in the eighth embodiment. Consequently, a voltage to (or from) which the detected deviation of the threshold is added (or subtracted) is applied to the inverter 75. A voltage proportional to display data is therefore applied to the capacitive load CL irrespective of the deviation of the threshold voltage of the inverter. In the ninth embodiment, therefore, even when the threshold voltage of an inverter serving as a comparing circuit is varied, the variation can be compensated for by means of a relatively simple configuration. The precision and homogeneity of the comparing circuit can be improved, and display quality can be improved.

In the ninth embodiment, for example, the first state is established during a vertical retrace period. The reference value generating circuit 74 and drive voltage generating circuit 78 output the signals shown in FIGS. 31 and 32 respectively, whereby a deviation of the threshold value of the inverter 75 is detected. During a display period, the second state is established, and an output proportional to display data is provided. When a leakage occurring in the compensating capacitor 94 is small enough, the frequency of establishing the first state can be reduced. For example, the first state is established once when the power supply is turned on.

Figure 34:
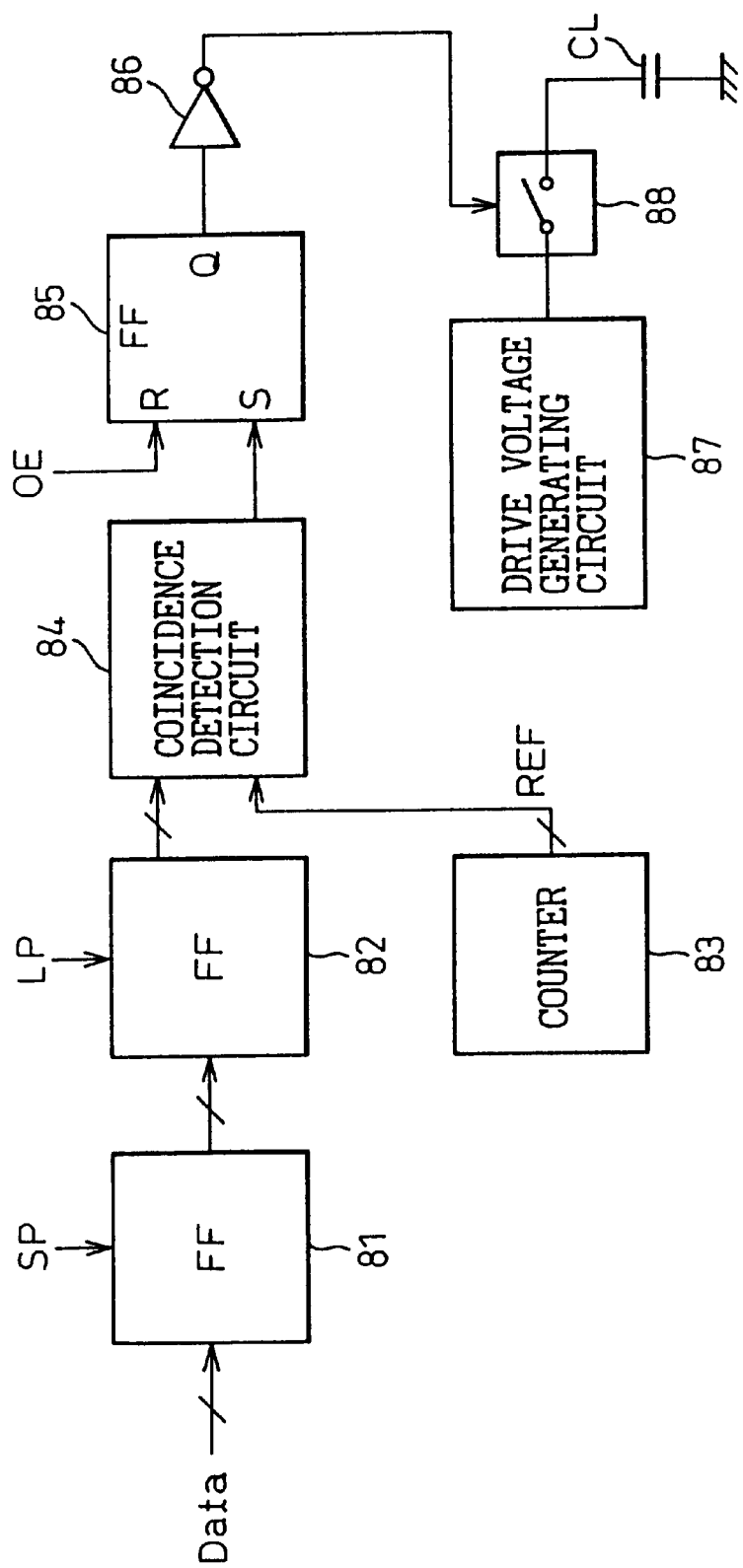
FIG. 34 is a diagram showing the configuration of a drive circuit for liquid-crystal displays in accordance with the tenth embodiment.

FIG. 34 is a diagram showing the configuration of a drive circuit in accordance with the tenth embodiment. In the eighth embodiment, analog display data is input. By contrast, in the tenth embodiment, digital display data is input. Flip-flops 81 and 82 are substituted for the analog sample-and-hold circuits 71 and 72, a counter 83 is substituted for the reference value generating circuit 74, a consistency detecting circuit 84 is substituted for the inverter 75 serving as a comparing circuit, and an R-S flip-flop (FF) 85 is substituted for the NAND 76. The operations of the components are nearly identical to those mentioned previously, though they are achieved by making logical decisions.

According to the tenth embodiment, since digital display data can be handled, the degree of matching with such equipment as a personal computer is improved, and interfacing can be simplified and speeded up. Despite a digital driver, such an analog part as a D/A converter is not employed. Consequently, higher-precision driving and smaller circuitry can be attained.

In this embodiment, a logic circuit for detecting consistency is used as the comparing means. Alternatively, for example, a logic circuit for comparing sizes may be employed. Using this logic circuit, the R-S flip-flop 85 can be omitted. After an output of the R-S flip-flop 82 operating as a second sample-and-hold circuit is pre-set using a counter that can be pre-set, a counting control signal such as a clock may be supplied as a signal REF. Counting down (or up) may be carried out, and an overflow signal (borrow signal or carry signal) may be utilized as a result of comparison. This is attributable to the fact that the timing of overflow varies depending on an initial value from which counting starts. A counter is more effective in designing a circuit compactly than a logic circuit for comparison.

The configurations of the eighth to tenth embodiments can be adapted to both a driver IC for a poly-crystalline silicon LCD having drive circuits inclusively and a driver IC for an amorphous silicon LCD, which are provided in the form of an IC. A more compact driver IC can be realized.

The configurations of the eighth to tenth embodiments can be adapted to the configurations of the fifth to seventh embodiments.

As described so far, according to the present invention, a drive circuit for liquid-crystal displays can be designed to be unsusceptible to the variation in the characteristic of a device, and a liquid-crystal display offering high display quality can be realized with small circuitry. Moreover, a supply voltage of a drive circuit can be lowered by controlling display data and a given voltage responsively to switching (reversing an alternating voltage) a positive voltage period and negative voltage period. Consequently, power consumption can be minimized and reliability can be improved.

Moreover, despite a relatively simple configuration, a writing time required by a data driver is much longer than that required according to the conventional point-sequential driving. A buffer employed in the data driver can be designed compactly, and the circuitry of the data driver can be reduced in size. Furthermore, since driving can be achieved to provide accurate gradation using simple circuitry, the circuitry can be reduced in size. This enables a reduction in cost, improvement of display quality, a reduction in power consumption, and an improvement in reliability.

These effects become outstanding especially when the present invention is applied to a poly-crystalline silicon LCD.

What is claimed is:

1. A drive circuit for liquid-crystal displays which applies a voltage to display cells in a liquid-crystal display, comprising:

a sampling circuit for sampling and holding display data;

a reference signal generating circuit for generating a reference signal that varies at intervals of a given cycle;

a comparing circuit for comparing an output of said sampling circuit with the reference voltage and outputting a result of a comparison;

a drive voltage generating circuit for generating a drive voltage that varies at intervals of a given cycle; and a switch to be made to apply the drive voltage to an output terminal according to an output of said comparing circuit.

2. A drive circuit for liquid-crystal displays according to claim 1, wherein: said display data and reference signal are analog signals; said sampling circuit includes an analog switch for sampling and a holding capacitor for sampling; said comparing circuit includes a sampling circuit for comparison composed of an analog signal for comparison and a holding capacitor for comparison, and a logic circuit; and after the reference signal is supplied as a reference potential at said holding capacitor for comparison and said sampling circuit for comparison samples display data, the reference signal is varied.

3. A drive circuit for liquid-crystal displays according to claim 2, wherein said logic circuit in said comparing circuit is an inverter.

4. A drive circuit for liquid-crystal displays according to claim 2, wherein said sampling circuit includes an analog buffer realized with a source-follower amplifier as an output stage.

5. A drive circuit for liquid-crystal displays according to claim 2, wherein said analog switch for sampling is made during an initialization period before sampling of display data is started, and a given initialization voltage is applied to said holding capacitor for sampling.

6. A drive circuit for liquid-crystal displays according to claim 2, wherein, assuming that the threshold voltage of said logic circuit in said comparing circuit is Vtinv, a range of values in which the threshold voltage is uncertain in the course of manufacturing is Vtinv, an amplitude of the display data representing one gradation level and an amplitude of the reference signal representing one gradation level are equal to or larger than Vtinv.

7. A drive circuit for liquid-crystal displays according to claim 2, further comprising a holding capacitor for correction, and a switching circuit for switching a first state in which said holding capacitor for correction is connected between an output terminal of said switch and a terminal at which a first give voltage exists, and a second state in which said holding capacitor is connected between said sampling circuit and said comparing circuit, wherein:

in the first state, said reference signal generating circuit outputs a reference wave that varies within the range of values within which the threshold voltage of said logic circuit in said comparing circuit varies, and said drive signal generating circuit outputs a wave that varies with the same amplitude as the reference wave with an arbitrary voltage as a center synchronously with the reference wave;

in the second state, said reference signal generating circuit outputs a signal produced by adding the arbitrary voltage to the reference signal, and said drive signal generating circuit outputs the drive signal; and during one horizontal synchronization period, after display data is sampled, the first state is established and thereafter the second state is established.

8. A drive circuit for liquid-crystal displays according to claim 1, wherein the display data is a digital signal, said sampling circuit is a digital latch, said comparing circuit is a digital comparing circuit, and said reference signal generating circuit is a counter for generating a reference value as a reference signal.

9. A drive circuit for liquid-crystal displays according to claim 8, wherein said digital comparing circuit is a larger value judging circuit for judging which of the display data and the reference value is larger.

10. A drive circuit for liquid-crystal displays according to claim 8, wherein said digital comparing circuit includes a consistency detecting circuit for judging whether or not the display data and reference value are mutually consistent, and a digital latch to be set or reset with an output of said consistency detecting circuit.

11. A drive circuit for liquid-crystal displays according to claim 1, wherein: the display data is a digital signal; said sampling circuit is a digital latch; and said comparing circuit is a counter capable of being initialized, inputs the reference signal as a counter operation control signal, performs counting after the display data is set as an initial count value, and outputs a carry signal or borrowing signal as a result of comparison.

12. A liquid-crystal display having a plurality of display cells and drive circuits for applying a voltage to said plurality of display cells, wherein:

said drive circuits each include:

a sampling circuit for sampling and holding display data;

a reference signal generating circuit for generating a reference signal that varies at intervals of a given cycle;

a comparing circuit for comparing an output of said sampling circuit with the reference signal and outputting a result of comparison;

a drive voltage generating circuit for generating a drive voltage that varies at intervals of the given cycle; and a switch to be made to apply the drive voltage to an output terminal according to an output of said comparing circuit.

13. A liquid-crystal display according to claim 12, wherein a positive voltage application period during which a positive voltage is applied to said display cells and a negative voltage application period during which a negative voltage is applied are switched for each display frame, and the drive voltage is a signal symmetrical to a center level during both the positive voltage application period and negative voltage application period.

14. A liquid-crystal display according to claim 12, wherein the drive voltage varies non-linearly.

* * * * *

UNITED STATES PATENT AND TRADEMARK OFFICE
CERTIFICATE OF CORRECTION

PATENT NO. : 6,392,629 B1
DATED : May 21, 2002
INVENTOR(S) : Murakami et al.

It is certified that error appears in the above-identified patent and that said Letters Patent is hereby corrected as shown below:

<u>Title page,</u>
Item [56], References Cited, please insert the following U.S. PATENT DOCUMENTS:
-- 5,051,739 --
-- 5,510,748 --
-- 5,627,557 --
-- 5,714,844 --
-- 5,734,379 --
-- 5,793,346 --
-- 5,896,117 --
-- 6,067,066 --
-- JP: 9,258,702 --
-- JP: 9,050,259 --

Signed and Sealed this

Twenty-fifth Day of February, 2003

JAMES E. ROGAN
*Director of the United States Patent and Trademark Office*